(12) United States Patent
Hashimoto et al.

(10) Patent No.: US 8,653,561 B2
(45) Date of Patent: Feb. 18, 2014

(54) III-NITRIDE SEMICONDUCTOR ELECTRONIC DEVICE, AND METHOD OF FABRICATING III-NITRIDE SEMICONDUCTOR ELECTRONIC DEVICE

(75) Inventors: Shin Hashimoto, Itami (JP); Katsushi Akita, Itami (JP); Yoshiyuki Yamamoto, Itami (JP); Masaaki Kuzuhara, Fukui (JP); Norimasa Yafune, Tenri (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 284 days.

(21) Appl. No.: 13/038,071

(22) Filed: Mar. 1, 2011

(65) Prior Publication Data

US 2011/0278647 A1 Nov. 17, 2011

(30) Foreign Application Priority Data

May 14, 2010 (JP) ................................ P2010-112280

(51) Int. Cl.
*H01L 21/02* (2006.01)
*H01L 29/778* (2006.01)
*H01L 21/335* (2006.01)

(52) U.S. Cl.
USPC ........... 257/194; 257/192; 257/195; 257/368; 257/410; 257/411; 257/94; 257/96; 257/E21.407; 257/E21.452; 257/E29.249

(58) Field of Classification Search
USPC .................. 257/194, 183, 192, 201, E29.246, 257/E29.249, 195, 368, 410, 411, 94, 96, 257/E21.407, E21.452, E29.2, 49
See application file for complete search history.

(56) References Cited

U.S. PATENT DOCUMENTS 6,064,082 A * 5/2000 Kawai et al. .................. 257/192

(Continued)

FOREIGN PATENT DOCUMENTS

JP 2008-243881 A 10/2008
JP 2009-049358 A 3/2009

OTHER PUBLICATIONS

Nanjo et al., "First Operation of AlGaN Channel High Electron Mobility Transistors," Applied Physics Express 1, pp. 011101-1-01101-3 (2008).

(Continued)

*Primary Examiner* — Zandra Smith
*Assistant Examiner* — Tsz Chiu
(74) *Attorney, Agent, or Firm* — Venable LLP; Michael A. Sartori; Tamatane J. Aga

(57) ABSTRACT

A III-nitride semiconductor electronic device comprises a semiconductor laminate provided on a primary surface of a substrate, a first electrode in contact with the semiconductor laminate, and a second electrode. The semiconductor laminate includes a channel layer and a barrier layer making a junction with the channel layer. The channel layer comprises first III-nitride semiconductor containing aluminum as a Group III constituent element, and the barrier layer comprises second III-nitride semiconductor containing aluminum as a Group III constituent element. The semiconductor laminate including first, second and third regions arranged along the primary surface, and the third region is located between the first region and the second region. The barrier layer includes first to third portions included in the first to third regions, respectively. A concentration of impurity in the first portion is the same as that of impurity in the second portion, and the first and second electrodes is provided on the first and second regions, respectively. The first electrode includes a drain electrode or a source electrode. An aluminum composition of the first III-nitride semiconductor is not less than 0.16, and a bandgap of the second III-nitride semiconductor being larger than that of the first III-nitride semiconductor.

48 Claims, 10 Drawing Sheets

(56) References Cited

U.S. PATENT DOCUMENTS

| | | | |
|---|---|---|---|
| 6,586,781 B2* | 7/2003 | Wu et al. | 257/194 |
| 6,624,452 B2* | 9/2003 | Yu et al. | 257/194 |
| 7,052,942 B1* | 5/2006 | Smart et al. | 438/162 |
| 8,148,751 B2* | 4/2012 | Hashimoto et al. | 257/192 |
| 2001/0053618 A1* | 12/2001 | Kozaki et al. | 438/933 |
| 2003/0020092 A1* | 1/2003 | Parikh et al. | 257/192 |
| 2006/0255364 A1* | 11/2006 | Saxler et al. | 257/192 |
| 2012/0211801 A1* | 8/2012 | Hashimoto et al. | 257/194 |
| 2013/0032781 A1* | 2/2013 | Miyoshi et al. | 257/18 |

OTHER PUBLICATIONS

Raman et al., "AlGaN Channel High Electron Mobility Transistors: Device Performance and Power-Switching Figure of Merit," Japanese Journal of Applied Physics, vol. 47, No. 5, pp. 3359-3361 (2008).

Arulkumaran et al., "High-Temperature effects of AlGaN/GaN high-electron-mobility transistors on sapphire and semi-insulating SiC substrates," Applied Physics Letters, vol. 80, No. 12, pp. 2186-2188 (2002).

* cited by examiner

Fig.2
(a)
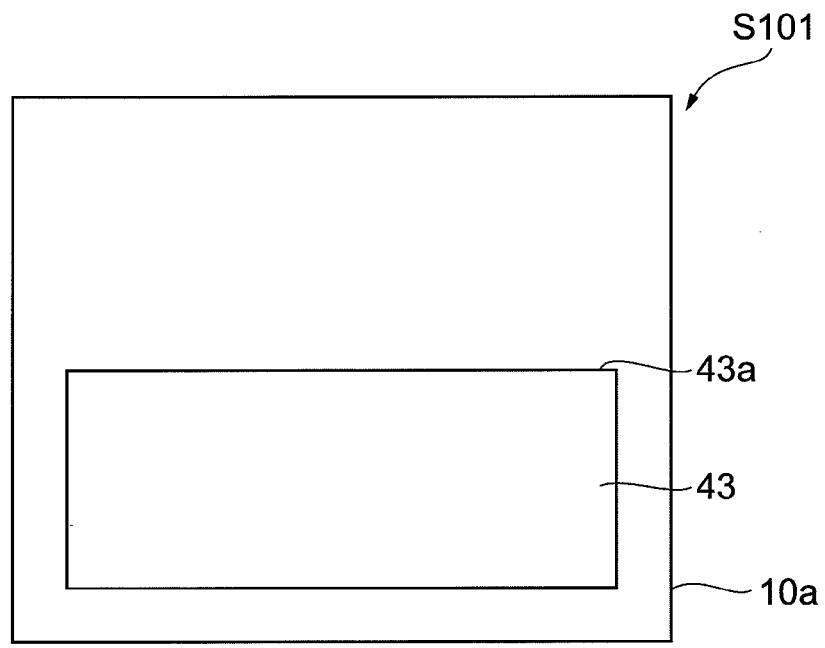
(b)
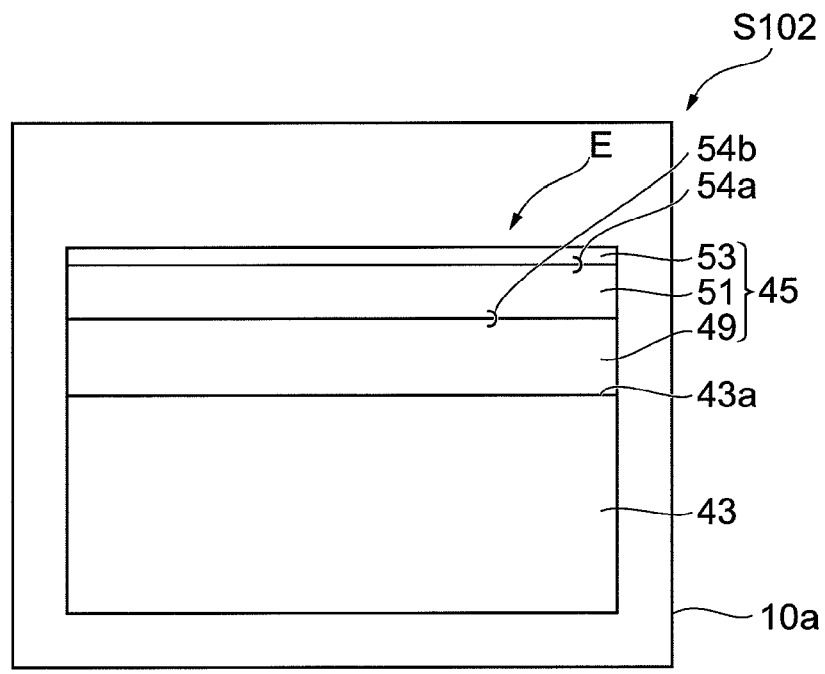

Fig.3
(a)
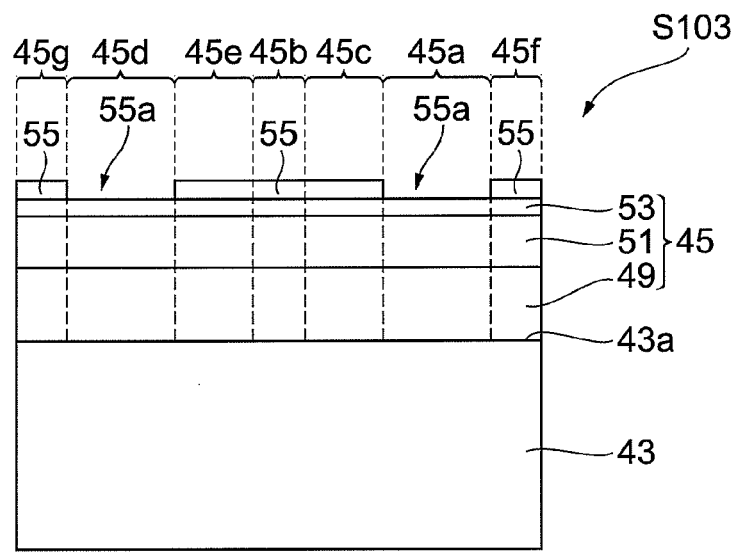
(b)
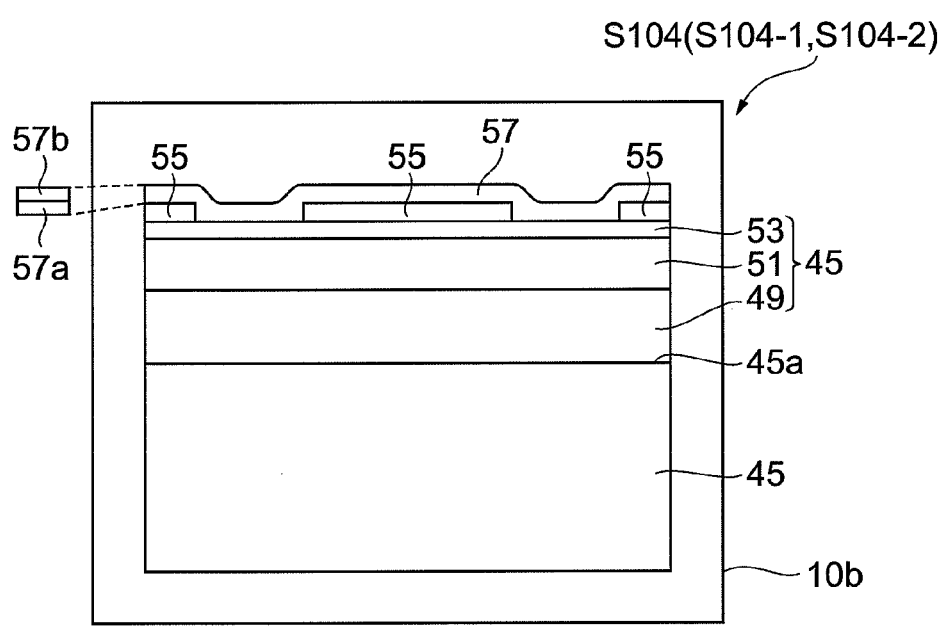

Fig.4
(a)
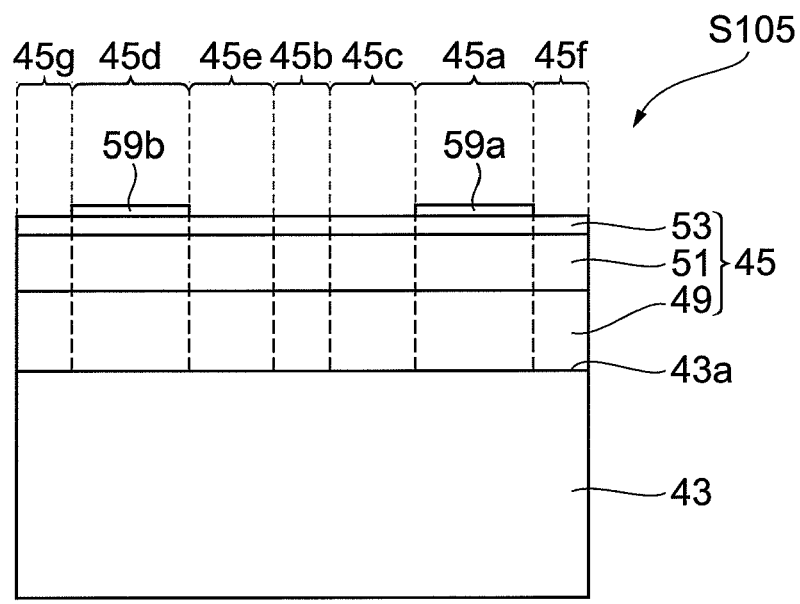
(b)
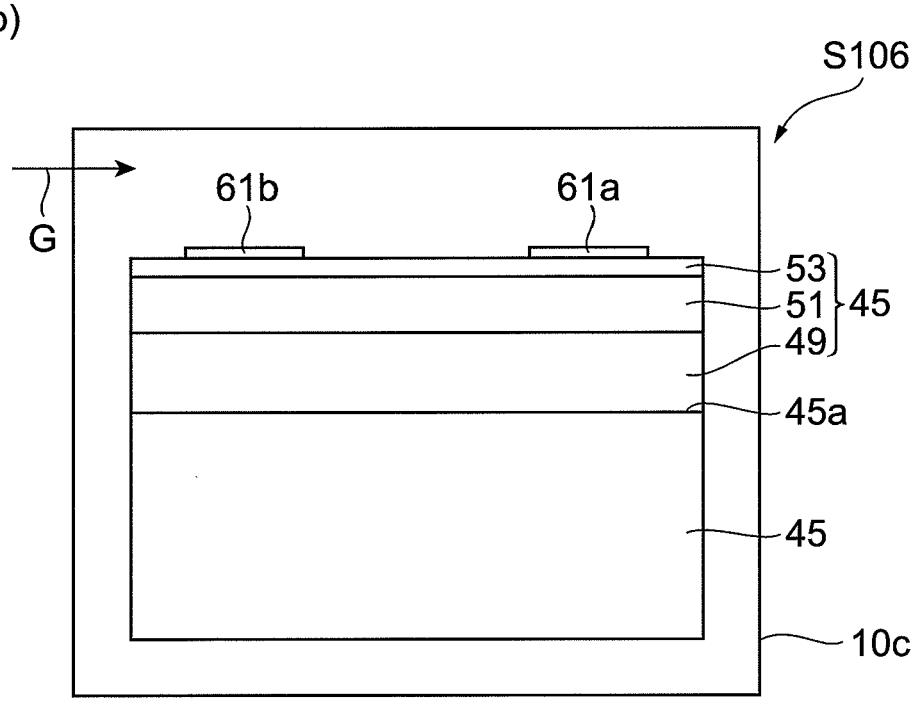

Fig.5
(a)
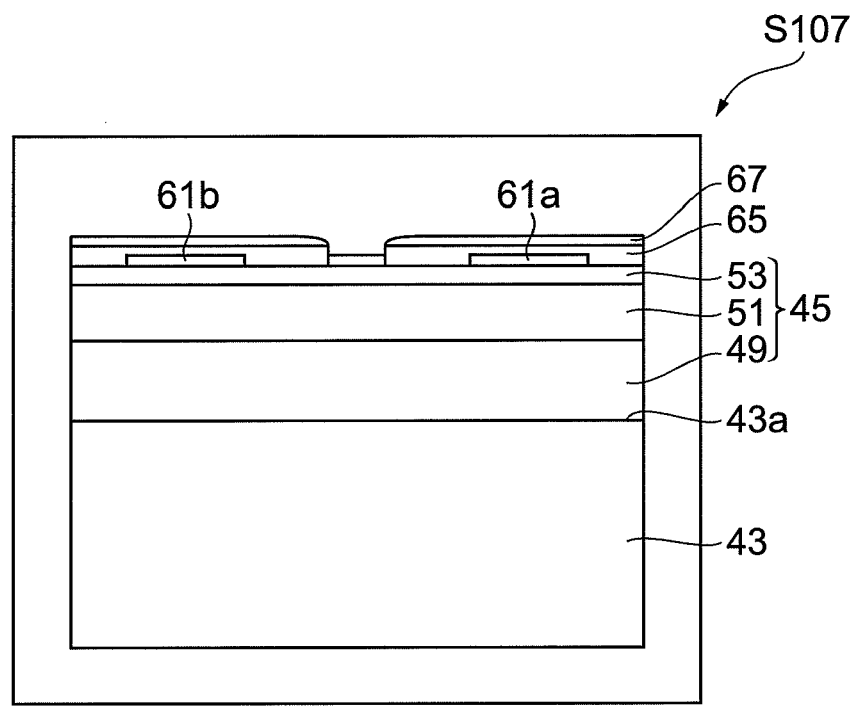
(b)
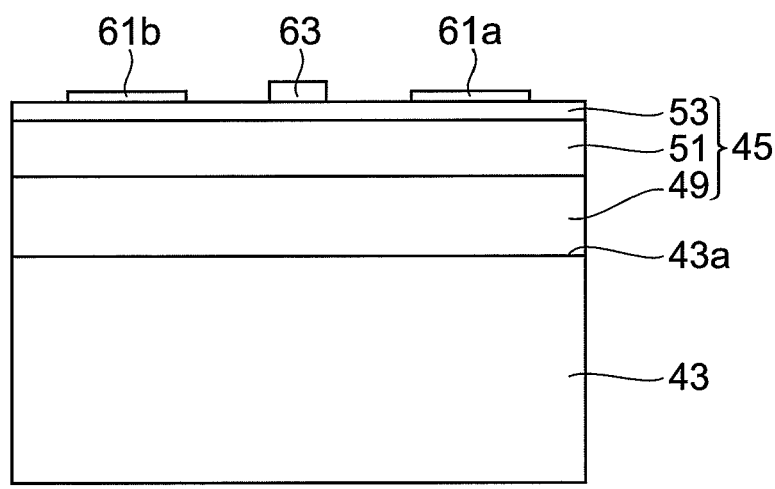

*Fig.6*
(a)
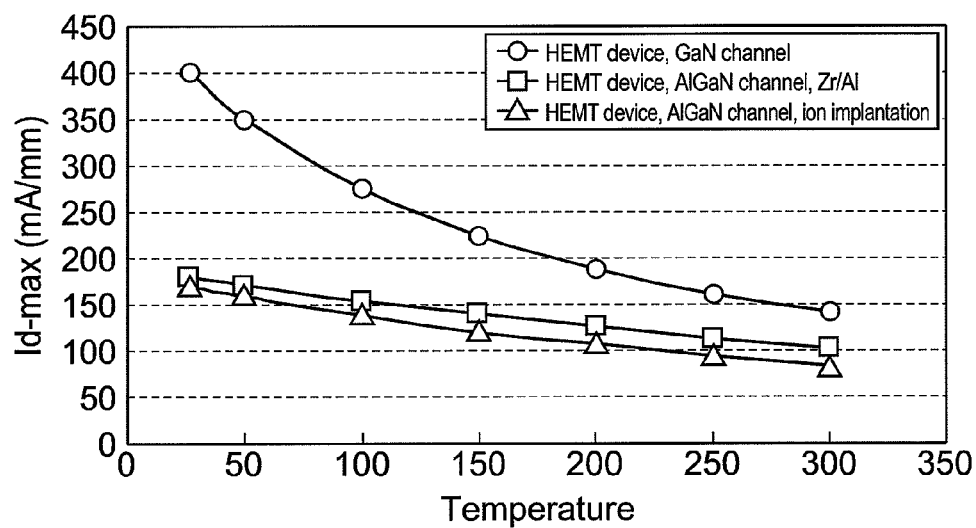
(b)
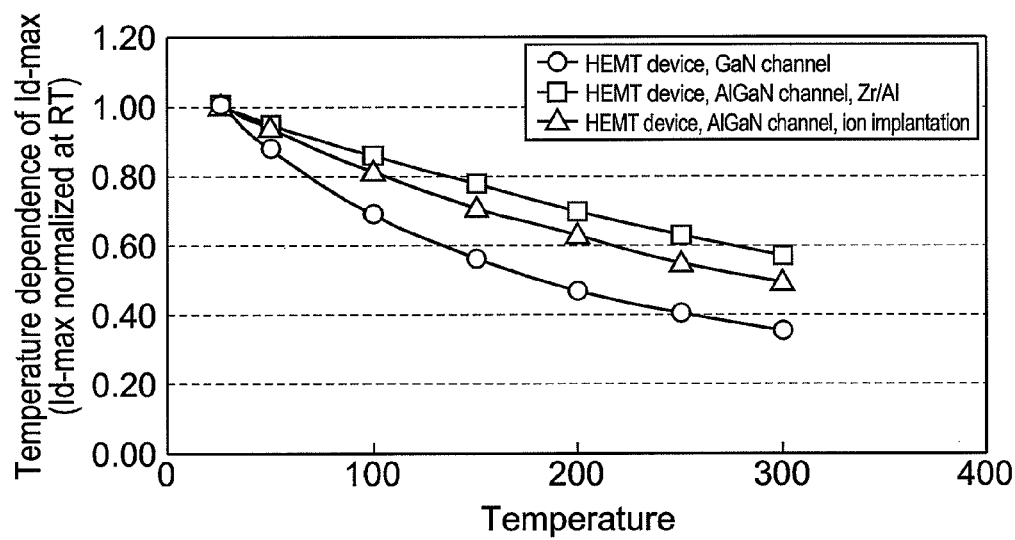

*Fig.7*

| Temperature | 27 | 50 | 100 | 150 | 200 | 250 | 300 |
|---|---|---|---|---|---|---|---|
| Sample A, GaN channel | 400 | 351 | 276 | 225 | 188 | 161 | 142 |
| (reduction rate) | 1.00 | 0.88 | 0.69 | 0.56 | 0.47 | 0.40 | 0.35 |
| Sample B, AlGaN channel, ion implantation | 170 | 159 | 138 | 120 | 107 | 94 | 84 |
| (reduction rate) | 1.00 | 0.93 | 0.81 | 0.71 | 0.63 | 0.55 | 0.49 |
| Sample C, AlGaN channel, Zr/Al | 180 | 171 | 155 | 140 | 126 | 113 | 103 |
| (reduction rate) | 1.00 | 0.95 | 0.86 | 0.78 | 0.70 | 0.63 | 0.57 |

Fig.8

| Sample No. | substrate, epitaxial structure, etc. | FWHM of XRC for AlN layer C | FWHM of XRC for AlN layer R | FWHM of XRC for AlGaN layer C | FWHM of XRC for AlGaN layer R | Sheet resistance Rs | Impurity concentrations H (hydrogen) | Impurity concentrations C (carbon) | Impurity concentrations O (oxygen) |
|---|---|---|---|---|---|---|---|---|---|
| X-1 | on sapphire substrate | 1447 | unmeasured | 1082 | 3453 | 18622 | $5.3 \times 10^{18}$ | $6.3 \times 10^{17}$ | $8.7 \times 10^{17}$ |
| X-2 | on sapphire substrate | 1025 | unmeasured | 811 | 1521 | 6252 | $3.7 \times 10^{18}$ | $3.1 \times 10^{17}$ | $5.6 \times 10^{17}$ |
| X-3 | on sapphire substrate | 682 | 987 | 625 | 995 | 3110 | $2.9 \times 10^{18}$ | $2.5 \times 10^{17}$ | $4.3 \times 10^{17}$ |
| X-4 | on sapphire substrate | 447 | 742 | 513 | 711 | 2754 | $2.0 \times 10^{18}$ | $1.5 \times 10^{17}$ | $3.3 \times 10^{17}$ |
| X-5 | on sapphire substrate, g-AlGaN buffer | | | 421 | 570 | 2641 | $1.9 \times 10^{18}$ | $1.4 \times 10^{17}$ | $3.1 \times 10^{17}$ |
| X-6 | on sapphire substrate, g-AlGaN buffer + AlN multilayer film | | | 413 | 562 | 2614 | $1.8 \times 10^{18}$ | $1.3 \times 10^{17}$ | $3.0 \times 10^{17}$ |
| X-7 | on AlN substrate | 47 | 67 | 177 | 332 | 2471 | $1.5 \times 10^{18}$ | $1.0 \times 10^{17}$ | $2.5 \times 10^{17}$ |
| X-8 | on AlGaN substrate | | | 84 | 159 | 2032 | $1.2 \times 10^{18}$ | $9.0 \times 10^{16}$ | $2.3 \times 10^{17}$ |

Fig.9

| Sample No. | substrate, epitaxial structure, etc. | FWHM of XRC for AlN layer | | | FWHM of XRC for AlGaN layer | | | Sheet resistance Rs | (with use of Zr/Al electrodes) | | | | (with use of ion implantation + activation annealing) | |
|---|---|---|---|---|---|---|---|---|---|---|---|---|---|---|
| | | C | | R | C | | R | | 200°C/RT | | 300°C/RT | | 200°C/RT | 300°C/RT |
| X-1 | on sapphire substrate | 1447 | | unmeasured | 1082 | | 3453 | 18622 | ohmic NG | | ohmic NG | | 0.58 | 0.42 |
| X-2 | | 1025 | | unmeasured | 811 | | 1521 | 6252 | ohmic NG | | ohmic NG | | 0.59 | 0.44 |
| X-3 | | 682 | | 987 | 625 | | 995 | 3110 | 0.68 | | 0.55 | | 0.6 | 0.45 |
| X-4 | | 447 | | 742 | 513 | | 711 | 2754 | 0.70 | | 0.57 | | 0.6 | 0.45 |
| X-5 | on sapphire substrate, g-AlGaN buffer | | | | 421 | | 570 | 2641 | 0.72 | | 0.60 | | 0.61 | 0.46 |
| X-6 | on sapphire substrate, g-AlGaN buffer + AlN multilayer film | | | | 413 | | 562 | 2614 | 0.72 | | 0.60 | | 0.61 | 0.46 |
| X-7 | on AlN substrate | 47 | | 67 | 177 | | 332 | 2471 | 0.75 | | 0.64 | | 0.62 | 0.47 |
| X-8 | on AlGaN substrate | | | | 84 | | 159 | 2032 | 0.76 | | 0.66 | | 0.63 | 0.48 |

III-NITRIDE SEMICONDUCTOR ELECTRONIC DEVICE, AND METHOD OF FABRICATING III-NITRIDE SEMICONDUCTOR ELECTRONIC DEVICE

BACKGROUND OF THE INVENTION

1. Field of the Invention

The present invention relates to a III-nitride semiconductor electronic device, and a method of fabricating a III-nitride semiconductor electronic device.

2. Related Background Art

Patent Literature 1 discloses a heterojunction type field effect transistor. This transistor has an AlGaN channel layer and an AlGaN barrier layer. Source/drain electrodes are formed with use of ion implantation of silicon and are made of Ti/Al.

Patent Literature 2 discloses a junction of channel layer/barrier layer. The channel layer is made of AlGaN. In a high electron mobility transistor including the AlGaN channel layer with an Al composition of not less than 0.16, ohmic electrodes of Ti/Al are formed using impurity doping by ion implantation. Its impurity concentration is not less than $1 \times 10^{18}$ cm$^{-3}$.

Non Patent Literature 1 discloses a high electron mobility transistor which uses an AlGaN channel layer and an AlGaN barrier layer. Silicon ions are implanted with the acceleration energy of 50 KeV and at the dose concentration of $1 \times 10^{15}$ cm$^{-2}$ into junction areas which are connected to the source electrode and the drain electrode, and Ti/Al electrodes are formed on the heavily-doped regions.

Non Patent Literature 2 discloses a high electron mobility transistor produced by an electron beam method. This high electron mobility transistor has an AlGaN channel layer with an Al composition of 0.06, and its ohmic electrodes are made of Ti/Al/Ni/Au.

Non Patent Literature 3 discloses an AlGaN/GaN high electron mobility transistor. In this AlGaN/GaN transistor, Id-max (maximum drain current) decreases with increase in temperature.

Patent Literature 1: Japanese Patent Application Laid-open No. 2008-243881
Patent Literature 2: Japanese Patent Application Laid-open No. 2009-049358
Non Patent Literature 1: Applied Physics Express 1, (2008) 011101, Takuma Nanjo, et al., "First Operation of AlGaN Channel High Electron Mobility Transistors."
Non Patent Literature 2: Japanese Journal of Applied Physics, Vol. 47, No. 5, 2008, pp-3359-3361, Ajay RAMAN, et al., "AlGaN Channel High Electron Mobility Transistors: Device Performance and Power-Switching Figure of Merit."
Non Patent Literature 3: APPLIED PHYSICS LETTERS, VOL. 80, No. 12, 25 Mar. 2002, pp-2186-2188, S. Arulkumaran, et al., "High Temperature Effects of AlGaN/GaN high-electron Mobility Transistors on sapphire and semi-insulating SiC substrates"

SUMMARY OF THE INVENTION

The object of the invention described in Patent Literature 1 is to provide the heterojunction field effect transistor capable of achieving a higher output power and higher breakdown voltage. Patent Literature 1 describes nothing about the drain current characteristic of the transistor. The object of the invention described in Patent Literature 2 is to reduce the contact resistance of the source/drain (ohmic) electrodes. In both of Patent Literatures 1 and 2, ion implantation is used for formation of the source/drain electrodes.

Non Patent Literature 3 discloses that the maximum drain current Id-max decreases with increase in temperature in the AlGaN/GaN high electron mobility transistor. None of Patent Literatures 1 and 2 and Non Patent Literatures 1-3 discloses such characteristic degradation and provides an answer to improve such characteristic degradation. According to Inventors' knowledge, the foregoing Id-max characteristic degradation is reduced by use of an AlGaN/AlGaN heterojunction.

The present invention has been accomplished in view of the above-described circumstances and it is an object of the present invention to provide a III-nitride semiconductor electronic device capable of reducing the Id-max characteristic degradation. It is another object of the present invention to provide a method of fabricating a III-nitride semiconductor electronic device, which can reduce the Id-max characteristic degradation.

A III-nitride semiconductor electronic device according to a first aspect of the present invention comprises: (a) a substrate; (b) a semiconductor laminate provided on a primary surface of the substrate; (c) a first electrode in contact with the semiconductor laminate; and (d) a second electrode provided on the semiconductor laminate. The semiconductor laminate includes a channel layer provided on the primary surface of the substrate and a barrier layer which makes a junction with the channel layer. The channel layer comprises a first III-nitride semiconductor, the first III-nitride semiconductor contains aluminum as a Group III constituent element. The barrier layer comprises a second III-nitride semiconductor, the second III-nitride semiconductor contains aluminum as a Group III constituent element. The semiconductor laminate includes first, second and third regions, the first, second and third regions are arranged along the primary surface of the substrate, and the third region is located between the first region and the second region. The channel layer includes first to third portions included in the first to third regions, respectively. A concentration of impurity in the first portion is the same as a concentration of impurity in the second portion, and the first and second electrodes are provided on the first and second regions, respectively. The first electrode includes either one of a drain electrode and a source electrode. The second electrode includes a gate electrode. An aluminum composition of the first III-nitride semiconductor is not less than 0.16, and a bandgap of the second III-nitride semiconductor is larger than a bandgap of the first III-nitride semiconductor.

In the foregoing III-nitride semiconductor electronic device, the channel layer comprises the first III-nitride semiconductor containing aluminum as a Group III constituent element and the barrier layer comprises the second III-nitride semiconductor containing aluminum as a Group III constituent element, thereby providing the III-nitride semiconductor electronic device that is capable of reducing degradation in the Id-max characteristics. Furthermore, the first and second electrodes are provided on the first and second regions of the semiconductor laminate, respectively. Since the impurity concentration of the first portion is the same as that of the second portion in the channel layer, the first portion in the channel layer is not subjected to ion implantation. Hence, the III-nitride semiconductor electronic device is provided as one capable of further reducing degradation in the Id-max characteristics.

In the III-nitride semiconductor electronic device according to the first aspect of the present invention, the barrier layer includes first to third portions included in the first to third regions, respectively, and an impurity concentration of the first portion can be the same as an impurity concentration of the second portion. In this electronic device, since the impurity concentration of the first portion is the same as that of the second portion in the barrier layer, the first portion in the barrier layer is not subjected to ion implantation, thereby providing the III-nitride semiconductor electronic device that is capable of reducing degradation in the Id-max characteristics.

In the III-nitride semiconductor electronic device according to the first aspect of the present invention, the impurity can include silicon. In this electronic device, the silicon impurity is introduced without supply by ion implantation and is introduced into the semiconductor laminate during formation of the semiconductor laminate through impurities contained in raw materials, contamination of a growth reactor, tools such as a heater in the growth reactor, and so on.

In the III-nitride semiconductor electronic device according to the first aspect of the present invention, a full width at half maximum (FWHM) of X-ray rocking curve (XRC) for a (10-12) plane of the channel layer is preferably less than 1000 arcsec. In this electronic device, no ion implantation is carried out for forming electrodes, so that no significant damage is caused thereby to the crystal quality during film formation. Hence, in the device provided without ion implantation for source/drain formation, a FWHM of XRC measured for the (10-12) plane of the channel layer affects the device characteristics of the III-nitride semiconductor electronic device. For example, the crystal quality based on this FWHM of XRC remains unchanged in the first region, which is preferable for reduction in contact resistance of the electrode. The temperature characteristics of drain current can be improved by the crystal quality associated with this FWHM of XRC.

In the III-nitride semiconductor electronic device according to the first aspect of the present invention, an FWHM of XRC for a (0002) plane of the channel layer is preferably less than 1000 arcsec. In this electronic device, no ion implantation is carried out, so that no significant damage to the crystal quality is caused thereby during film formation. Hence, in the device provided without using ion implantation for source/drain formation, the FWHM of XRC for the (10-12) plane of the channel layer is associated with the device characteristics of the III-nitride semiconductor electronic device. For example, the crystal quality associated with this FWHM of XRC remains unchanged in the first region, which is preferable for reduction in contact resistance of the electrode. The temperature characteristic of drain current can be improved by the crystal quality associated with the FWHM of XRC.

The III-nitride semiconductor electronic device according to the first aspect of the present invention can further comprise an $Al_XGa_{1-X}N$ (0<X≤1) layer provided between the semiconductor laminate and the substrate. The substrate comprises sapphire, SiC, Si, or the like. This electronic device permits the provision of the AlGaN channel layer on the substrate of sapphire, SiC, Si, or the like. Alternatively, in the III-nitride semiconductor electronic device according to the first aspect of the present invention, the substrate can comprise $Al_YGa_{1-Y}N$ (0<Y≤1). This electronic device permits provision of the AlGaN channel layer on an AlGaN substrate or on an AlN substrate.

The III-nitride semiconductor electronic device according to the first aspect of the present invention can further comprise an $Al_ZGa_{1-Z}N$ (0<Z≤1) layer provided between the semiconductor laminate and the substrate. The $Al_ZGa_{1-Z}N$ layer preferably has an aluminum composition monotonically increasing in a direction from the semiconductor laminate to the substrate. In this III-nitride semiconductor electronic device, the graded composition improves the crystal quality of a semiconductor layer provided on the $Al_ZGa_{1-Z}N$ (0<Z≤1) layer.

The III-nitride semiconductor electronic device according to the first aspect of the present invention can further comprise a multilayer film provided between the semiconductor laminate and the substrate. Preferably, the multilayer film includes $Al_CGa_{1-C}N$ (0<C<1) layers and $Al_DGa_{1-D}N$ (C<D≤1) layers alternately arranged and aluminum compositions of the $Al_CGa_{1-C}N$ (0<C<1) layers are preferably constant. In this III-nitride semiconductor electronic device, the multilayer film improves the crystal quality of a semiconductor layer provided on the $Al_CGa_{1-C}N$ (0<C<1) layer. The $Al_DGa_{1-D}N$ (U<D≤1) layers preferably contain AlN because use of AlN permits implementation of higher resistance (or suppression of decrease in resistance).

The III-nitride semiconductor electronic device according to the first aspect of the present invention can further comprise a multilayer film provided between the semiconductor laminate and the substrate. Preferably, the multilayer film includes $Al_UGa_{1-U}N$ (0<U<1) layers and $Al_VGa_{1-V}N$ (U<V≤1) layers alternately arranged, and aluminum compositions of the $Al_UGa_{1-U}N$ (0<U<1) layers monotonically increase in a direction from the semiconductor laminate to the substrate. In this III-nitride semiconductor electronic device, the composition inclination in the multilayer film improves the crystal quality of a semiconductor layer provided on the $Al_UGa_{1-U}N$ (0<U<1) layer. The $Al_VGa_{1-V}N$ (U<V≤1) layers preferably contain AlN. It is because use of AlN permits implementation of higher resistance (or suppression of reduction in resistance).

In the III-nitride semiconductor electronic device according to the first aspect of the present invention, preferably, the channel layer comprises AlGaN, and the barrier layer comprises AlGaN. This III-nitride semiconductor electronic device can be provided with an AlGaN/AlGaN heterojunction.

In the III-nitride semiconductor electronic device according to the first aspect of the present invention, a hydrogen concentration of the channel layer can be less than $3 \times 10^{18}$ cm$^{-3}$. The reason for it is that in this electronic device, if the hydrogen concentration is less than that, an ohmic electrode can be provided without dopant enhancement by ion implantation. In the III-nitride semiconductor electronic device according to the first aspect of the present invention, a carbon concentration of the channel layer can be not more than $2.5 \times 10^{17}$ cm$^{-3}$. The reason for it is that in this electronic device, if the carbon concentration is not more than that, an ohmic electrode can be provided without use of ion implantation. Furthermore, in the III-nitride semiconductor electronic device according to the first aspect of the present invention, an oxygen concentration of the channel layer can be not more than $4.3 \times 10^{17}$ cm$^{-3}$. The reason for it is that in this electronic device, if the oxygen concentration is not more than that, an ohmic electrode can be provided without use of ion implantation.

In the III-nitride semiconductor electronic device according to the first aspect of the present invention, a maximum drain current at 200 Celsius degrees can be not less than 0.68 times a maximum drain current at room temperature (e.g., 27 Celsius degrees). In the III-nitride semiconductor electronic device according to the first aspect of the present invention, a maximum drain current at 300 Celsius degrees can be not less than 0.55 times a maximum drain current at room temperature (e.g., 27 Celsius degrees).

In the III-nitride semiconductor electronic device according to the first aspect of the present invention, preferably, the first electrode contains Zr and Al. In this electronic device, the contact resistance to the III-nitride semiconductor that contains aluminum as a Group III constituent element can be reduced without need for ion implantation. This can also be achieved by use of electrodes other than Zr and Al and thus it is not always limited to Zr and Al.

A second aspect of the present invention is a method of fabricating a III-nitride semiconductor electronic device. The method comprises the steps of: (a) growing a semiconductor laminate on a primary surface of a substrate, the semiconductor laminate having a contact area for formation of an ohmic electrode; and (b) forming a first electrode on the contact area, without ion implantation in the contact area of the semiconductor laminate. The first electrode includes either one of a drain electrode and a source electrode. The semiconductor laminate includes a channel layer and a barrier layer, the channel layer is provided on the primary surface of the substrate, and the barrier layer makes a junction with the channel layer. The channel layer comprises a first III-nitride semiconductor, and the first III-nitride semiconductor contains aluminum as a Group III constituent element. The barrier layer comprises a second III-nitride semiconductor, and the second III-nitride semiconductor contains aluminum as a Group III constituent element. An aluminum composition of the first III-nitride semiconductor is not less than 0.16, and a bandgap of the second III-nitride semiconductor is larger than a bandgap of the first III-nitride semiconductor.

In this fabricating method, the channel layer comprises the first III-nitride semiconductor containing aluminum as a Group III constituent element and the barrier layer comprises the second III-nitride semiconductor containing aluminum as a Group III constituent element. Hence, it provides the III-nitride semiconductor electronic device capable of reducing degradation in the Id-max characteristics thereof Furthermore, since the first electrode is formed on the contact area without ion implantation in the contact area of the semiconductor laminate, the III-nitride semiconductor electronic device is provided as one capable of further reducing degradation in the Id-max characteristics.

The fabricating method according to the second aspect of the present invention can comprise the steps of (c) growing a buffer layer on the substrate, before forming the semiconductor laminate; and (d) forming a second electrode on the semiconductor laminate. The semiconductor laminate includes first, second, and third regions arranged along the primary surface of the substrate, and the third region is located between the first region and the second region. The channel layer includes first to third portions included in the first to third regions, respectively, and an impurity concentration of the first portion is the same as an impurity concentration of the second portion. The first and second electrodes are provided on the first and second regions, respectively, and the second electrode includes a gate electrode.

In the fabricating method according to the second aspect of the present invention, the step of forming the first electrode can include the steps of: depositing Zr on the contact area; depositing Al on the contact area; and performing annealing at a temperature of not more than 1200 Celsius degrees, after the deposition of Zr and Al. This fabricating method can form the electrode having an excellent ohmic contact. It is noted that an ohmic electrode can also be made of another electrode when the method includes the step of performing annealing at the temperature of not more than 1200 Celsius degrees.

In the fabricating method according to the second aspect of the present invention, the first electrode can contain Zr and Al. This fabricating method can reduce resistance in the contact, connected to the III-nitride semiconductor that contains aluminum as a Group III constituent element, without need for ion implantation.

In the second aspect of the present invention, the first electrode preferably contains Zr and Al. This method can provide good contact resistance to the III-nitride semiconductor with a high Al composition.

A third aspect of the present invention is a method for fabricating a III-nitride semiconductor electronic device. The method comprises the steps of (a) growing a semiconductor laminate on a primary surface of a substrate, the semiconductor laminate having a contact area for an ohmic electrode, the semiconductor laminate including a semiconductor layer and comprising a III-nitride semiconductor, and the III-nitride semiconductor containing aluminum as a Group III constituent element; and (b) forming a first electrode on the contact area, without ion implantation in the contact area of the semiconductor laminate. An aluminum composition of the III-nitride semiconductor is not less than 0.16. This method permits the formation of the first electrode on the contact area with the high Al composition, with being not impeded by defects which can be introduced into the semiconductor layer by ion implantation.

In the third aspect of the present invention, forming the first electrode can comprise the steps of: depositing Zr on the contact area by an electron beam method; depositing Al on the contact area by the electron beam method; and performing annealing at a temperature of not more than 1200 Celsius degrees, after deposition of the Zr and the Al. This fabricating method can form the electrode having an excellent ohmic contact. The method of depositing the electrode is not limited to the electron beam method, but it can be any method, e.g., sputtering, resistance heating, and so on.

The above objects and other objects, features, and advantages of the present invention can more readily become clear from the following detailed description of the preferred embodiments of the present invention proceeding with reference to the accompanying drawings.

BRIEF DESCRIPTION OF THE DRAWINGS

FIG. 2 is a drawing showing principal steps in a method for manufacturing a III-nitride semiconductor electronic device according to an embodiment of the present invention.

FIG. 3 is a drawing showing principal steps in the method for manufacturing the III-nitride semiconductor electronic device according to the embodiment.

FIG. 4 is a drawing showing principal steps in the method for manufacturing the III-nitride semiconductor electronic device according to the embodiment.

FIG. 5 is a drawing showing major steps in the method for manufacturing the III-nitride semiconductor electronic device according to the embodiment.

FIG. 6 is a drawing showing temperature dependences of maximum drain current (Id-max) of HEMT devices A, B and C.

FIG. 7 is a drawing showing a table of temperature dependences of maximum drain current (Id-max) of HEMT devices A, B and C.

FIG. 8 is a drawing showing the fabrication conditions and measurement results in an additional experiment.

FIG. 9 is a drawing showing the fabrication conditions and measurement results in the additional experiment.

DETAILED DESCRIPTION OF THE PREFERRED EMBODIMENTS

The expertise of the present invention can be readily understood in view of the following detailed description with reference to the accompanying drawings presented by way of illustration.

Embodiments of the III-nitride semiconductor electronic device and the method for manufacturing the III-nitride semiconductor electronic device will be described below with reference to the accompanying drawings. The same portions will be denoted by the same reference signs as much as possible.

Figure 1:
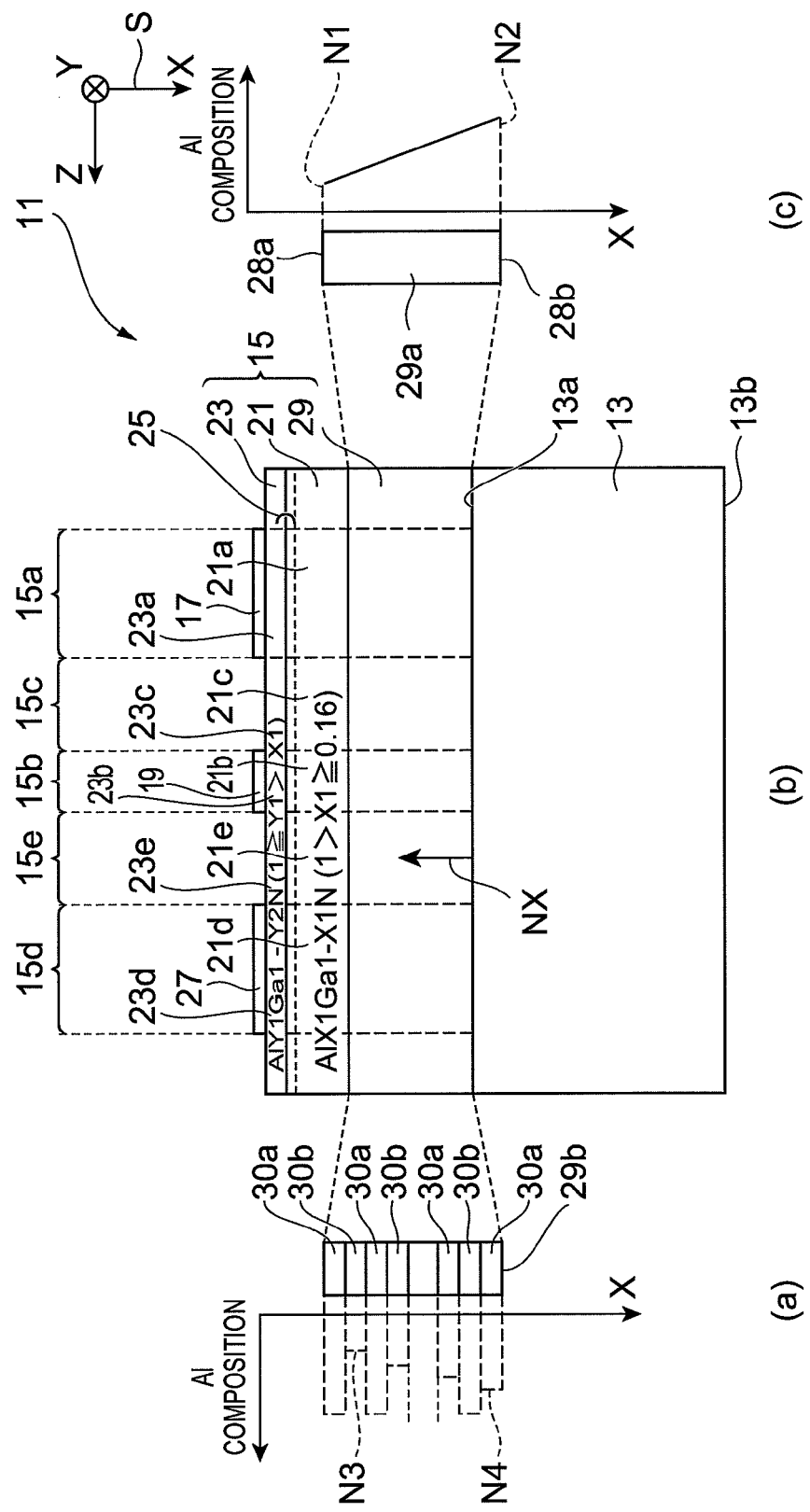
FIG. 1 is a drawing schematically showing a III-nitride semiconductor electronic device according to an embodiment of the present invention.

FIG. 1 is a drawing schematically showing a III-nitride semiconductor electronic device according to an embodiment of the present invention. With reference to part (b) of FIG. 1, the III-nitride semiconductor electronic device 11 comprises a substrate 13, a semiconductor laminate 15, a first electrode 17 and a second electrode 19. The substrate 13 has a primary surface 13a and a back surface 13b, and is preferably made of insulating or semi-insulating material, but it is also possible to use an electroconductive substrate. The semiconductor laminate 15 is provided on the primary surface 13a of the substrate 13. The first electrode 17 is in contact with the semiconductor laminate 15. The second electrode 19 is provided on the semiconductor laminate 15. The first electrode 17 includes either one of a drain electrode and a source electrode of the III-nitride semiconductor electronic device 11. The second electrode 19 includes a gate electrode of the III-nitride semiconductor electronic device 11. The second electrode 19 can comprises, for example, Ni and Au.

The semiconductor laminate 15 includes a channel layer 21 and a barrier layer 23. The channel layer 21 and barrier layer 23 are provided above the primary surface 13a of the substrate 13, and are arranged along an axis Nx (which is the x-axis of the coordinate system S shown in FIG. 1) normal to the primary surface 13a. The barrier layer 23 makes a heterojunction 25 with the channel layer 21. In the channel layer 21, two-dimensional electron gas is generated along the heterojunction 25.

The channel layer 21 is made of a first III-nitride semiconductor which comprises aluminum as a Group III constituent element, and the first III-nitride semiconductor comprises, for example, $In_{X2}Al_{X1}Ga_{1-X1-X2}N$ ($0.16 \leq X1 < 1$, $0 \leq X2 < 1$, $0 < X1+X2 \leq 1$). The first III-nitride semiconductor can comprise, for example, AlInGaN, AlGaN or the like. The barrier layer 23 is made of a second III-nitride semiconductor which comprises aluminum as a Group III constituent element, and the second III-nitride semiconductor can be made of, for example, $In_{Y2}Al_{Y1}Ga_{1-Y1-Y2}N$ ($X1 < Y1 \leq 1$, $0 \leq Y2 < 1$, $0 < Y1+Y2 \leq 1$). The second III-nitride semiconductor can be made of, for example, AlInGaN, AlInN, AlGaN, AlN or the like. The bandgap of the second III-nitride semiconductor is larger than that of the first III-nitride semiconductor. In a preferred example, the channel layer 21 is made of, for example, $Al_{X1}Ga_{1-X1}N$ ($0.16 \leq X1 <$), and the barrier layer 23 is made of, for example, $Al_{Y1}Ga_{1-Y1}N$ ($X1 < Y1 \leq 1$).

The semiconductor laminate 15 includes first, second and third regions 15a, 15b and 15c, and the first to third regions 15a-15c are arranged along the primary surface 13a of the substrate 13 (the z-axis of the coordinate system S shown in FIG. 1). The third region 15c is located between the first region 15a and the second region 15b. The channel layer 21 includes first, second and third portions 21a, 21b and 21c, and the first to third portions 21a-21c are included in the first to third regions 15a-15c, respectively, of the semiconductor laminate 15. In the channel layer 21, an impurity concentration of the first portion 21a is the same as that of the second portion 21b, so that no ion implantation is effected in the first portion 21a. The first electrode 17 is provided above the first portion 21a and the second electrode 19 is provided above the second portion 21b. The impurity distribution of the channel layer 21 achieved in the growth remains unchanged, so that no ion implantation is effected in the channel layer 21. Hence, the first to third portions 21a-21c have substantially the same impurity concentration as each other.

The barrier layer 23 includes first, second and third portions 23a, 23b and 23c, and the first to third portions 23a-23c are included in the first to third regions 15a-15c, respectively, of the semiconductor laminate 15. In the barrier layer 23, an impurity concentration of the first portion 23a is the same as that of the second portion 23b, so that no ion implantation is effected in the first portion 23a. The first electrode 17 is provided on the first portion 23a and the second electrode 19 is provided on the second portion 23b. The impurity distribution of the barrier layer 23 achieved in the growth remains unchanged, so that no ion implantation is effected in the barrier layer 23. Hence, the first to third portions 23a-23c have substantially the same impurity concentration.

In the III-nitride semiconductor electronic device 11, the channel layer 21 comprise the first III-nitride semiconductor which contains aluminum as a Group III constituent element, and the barrier layer 23 comprises the III-nitride semiconductor with the bandgap larger than that of the channel layer 21. Since the channel layer 21 is not made of GaN but of the nitride semiconductor that contains aluminum as a Group III constituent element, the III-nitride semiconductor electronic device 11 is provided as one capable of reducing the Id-max characteristic degradation.

Since the impurity concentration of the first portion 21a is identical to that of the second portion 21b in the channel layer 21, the first portion in the channel layer 21 is not subjected to ion implantation. The first and second electrodes 17 and 19 are provided above the first and second portions 21a and 21b, respectively, of the channel layer 21, and extend in the direction of the y-axis of the coordinate system S shown in FIG. 1. As described below in the present embodiment, the semiconductor laminate 15 is not subjected to partial ion implantation for enhancing a carrier concentration in the semiconductor regions immediately below the source electrode and the drain electrode. This avoidance of use of ion implantation leads to provision of the III-nitride semiconductor electronic device 11 capable of further reducing degradation in the Id-max characteristics.

The foregoing impurity can include, for example, silicon. In this III-nitride semiconductor electronic device 11, the silicon impurity is introduced without need for supply through ion implantation, and is introduced into the semiconductor laminate 15 from the following: impurities contained in raw materials for formation of the semiconductor laminate 15; contamination of a growth reactor; tools such as a heater in the growth reactor; and so on. On the other hand, this introduction is unintentional, and the channel layer 21 and the barrier layer 23 are grown as undoped layers when the channel layer 21 and barrier layer 23 are grown without supply of any dopant source during the growth. It is noted that the barrier layer 23 can be subjected to intentional impurity doping if necessary. On the other hand, in order to avoid degradation of crystal quality, it is preferable to perform no intentional impurity introduction for the channel layer 21.

The semiconductor laminate 15 includes fourth and fifth regions 15d and 15e and the first to fifth regions 15a-15e, and these regions are arranged along the primary surface 13a (the z-axis of the coordinate system S shown in FIG. 1) of the substrate 13. The fifth region 15e is located between the second region 15b and the fourth region 15d. The channel layer 21 includes fourth and fifth portions 21d, 21e and the first to fifth portions 21a-21e which are included in the first to fifth regions 15a-15e of the semiconductor laminate 15, respectively. In the channel layer 21, an impurity concentration of the fourth portion 21d is the same as that of the fifth portion 21e because no ion implantation is effected in the fourth portion 21d. A third electrode 27 is provided above the fourth portion 21d. The first to fifth portions 21a-21e have substantially the same impurity concentration. The impurity distribution of the channel layer 21 achieved in the growth remains unchanged because the channel layer 21 is not subjected to ion implantation.

The barrier layer 23 includes fourth and fifth portions 23d, 23e and the first to fifth portions 23a-23e, which are included in the first to fifth regions 15a-15e of the semiconductor laminate 15, respectively. In the barrier layer 23, an impurity concentration of the fourth portion 23d is the same as that of the fifth portion 23e because no ion implantation is effected in the fourth portion 23d. The third electrode 27 is provided on the fourth portion 23d. The first to fifth portions 23a-23e have substantially the same impurity concentration. The impurity distribution of the barrier layer 23 achieved through the growth remains unchanged. The barrier layer 23 is not subjected to ion implantation. Since the first electrode 17 includes either one of the drain electrode and source electrode of the III-nitride semiconductor electronic device 11 as described above, the third electrode 27 includes the other of the drain electrode and source electrode. The third electrode 27 comprises, for example, Zr and Al. In the fourth portion 23d, the semiconductor laminate 15 is not subjected to ion implantation for enhancing the carrier concentration in the semiconductor region just below the source electrode and/or the drain electrode. This avoidance of use of ion implantation leads to provision of the III-nitride semiconductor electronic device 11 capable of further reducing degradation in the Idmax characteristic.

Preferred materials of barrier layer 23/channel layer 21 are, for example, AlGaN/AlGaN, AlN/AlGaN, AlInN/AlGaN, or the like. A hydrogen concentration of the channel layer 21 can be less than $3 \times 10^{18}$ cm$^{-3}$. The reason for it is that if the hydrogen concentration is lower than that, this III-nitride semiconductor electronic device 11 can be provided with formation of ohmic contacts without use of ion implantation. In the III-nitride semiconductor electronic device 11, a carbon concentration of the channel layer 21 can be not more than $2.5 \times 10^{17}$ cm$^{-3}$. The reason for it is that if the carbon concentration is not more than that, this III-nitride semiconductor electronic device 11 can be provided with formation of ohmic contacts without use of ion implantation. Furthermore, in the III-nitride semiconductor electronic device 11, an oxygen concentration of the channel layer 21 can be not more than $4.3 \times 10^{17}$ cm$^{-3}$. The reason for it is that if the oxygen concentration is not more than that, this III-nitride semiconductor electronic device 11 can be provided with formation of ohmic contacts without use of ion implantation.

In the III-nitride semiconductor electronic device 11, the semiconductor laminate 15 is not subjected to ion implantation for enhancing the carrier concentration in the semiconductor regions just below the source electrode and the drain electrode such that a full width at half maximum (FWHM) of XRC for a (10-12) plane of the channel layer 21 is preferably less than 1000 arcsec. In the electronic device produced without ion implantation as above, the crystal quality of the channel layer 21 and/or the barrier layer 23 in an electrode forming step is not significantly degraded as compared with the crystal quality in the film formation. For this reason, in the device produced without ion implantation for source/drain, the degree of FWHM of XRC for the (10-12) plane of the channel layer 21 is associated with the device characteristics of the III-nitride semiconductor electronic device 11. For example, since the crystal quality based on this XRC FWHM is maintained in the first region 15a, it is suitable for reduction in contact resistance of the electrode 17 (and also for the electrode 27). The crystal quality based on the FWHM of XRC allows improvement in ohmic contact characteristics of the electrodes 17 and 27, and allows improvement in temperature characteristic of drain current as well.

Furthermore, a FWHM of XRC for a (0002) plane of the channel layer 21 is preferably less than 1000 arcsec. In the device produced without ion implantation for source/drain, the degree of FWHM of XRC for the (10-12) plane of the channel layer 21 is associated with the device characteristics of the III-nitride semiconductor electronic device. For example, since the crystal quality indicated by the FWHM of XRC is maintained in the first region 15a, it is suitable for reduction in contact resistance of the electrode 17 (and also for the electrode 27). Furthermore, the crystal quality based on the FWHM of XRC allows improvement in ohmic contact characteristics of the electrodes 17 and 27, and allows improvement in temperature characteristic of drain current as well.

As described above, when the XRC properties of the C-plane and R-plane of the channel layer 21 are excellent, the ohmic contact characteristics become stable in formation of the ohmic contacts.

The first electrode 17 preferably contains Zr and Al. For example, Zr/Al can reduce the contact resistance to the III-nitride semiconductor containing aluminum as a Group III constituent element, without need for ion implantation. It is noted that the electrode can also be made of materials except for Zr/Al.

The III-nitride semiconductor electronic device can further comprise an $Al_XGa_{1-X}N$ (0<X≤1) layer 29, and the $Al_XGa_{1-X}N$ (0<X≤1) layer 29 is provided between the semiconductor laminate 15 and the substrate 13. The substrate 13 can be an insulator such as a sapphire substrate, SiC substrate, AlN substrate, or AlGaN substrate, but it can also be an electroconductive substrate such as a Si substrate, n-type SiC substrate, or the like. When the substrate 13 is made of, for example, sapphire, the channel layer 21 of AlGaN is provided above the sapphire substrate through the use of the $Al_XGa_{1-X}N$ (0<X≤1) layer 29. In another example, where the substrate 13 is made of $Al_YGa_{1-Y}N$ (0<Y≤1), the channel layer of AlGaN is provided above an AlGaN substrate or an AlN substrate. When these substrate materials are used, an Al composition is not intentionally changed in formation of the $Al_XGa_{1-X}N$ layer 29, and the $Al_XGa_{1-X}N$ layer 29 comes to have the single Al composition.

With reference to part (c) of FIG. 1, the III-nitride semiconductor electronic device 11 can be provided with an $Al_ZGa_{1-Z}N$ (0<Z≤1) layer 29a, which acts as the $Al_XGa_{1-X}N$ layer 29. The inclined-composition $Al_ZGa_{1-Z}N$ layer 29a is provided between the semiconductor laminate 15 and the substrate 13. $Al_ZGa_{1-Z}N$ preferably has monotonic change of aluminum composition in the direction from the semiconductor laminate 15 toward the substrate 13. In the graded-composition $Al_ZGa_{1-Z}N$ layer 29a, the aluminum composition N1 in one surface 28a is smaller than the aluminum composition N2 in the other surface 28b. $Al_ZGa_{1-Z}N$ shows inclination of composition and, in the example shown in part (c) of FIG. 1, the aluminum composition increases in the direction from the semiconductor laminate 15 to the substrate 13. This graded composition allows improvement in crystal quality of the semiconductor layer that is provided on the inclined-composition $Al_ZGa_{1-Z}N$ (0<Z≤1) layer 29a.

With reference to part (a) of FIG. 1, the III-nitride semiconductor electronic device 11 can be provided with a multilayer film 29b, which acts as the $Al_XGa_{1-X}N$ layer 29. The multilayer film 29b is provided between the semiconductor laminate 15 and the substrate 13. The multilayer film 29b includes a plurality of $Al_UGa_{1-U}N$ (0<U<1) layers 30a and a plurality of $Al_VGa_{1-V}N$ (U<V≤1) layers 30b, and the $Al_UGa_{1-U}N$ layers 30a and the $Al_VGa_{1-V}N$ layers 30b are alternately arranged. Aluminum compositions of the $Al_VGa_{1-V}N$ layers 30b are larger than those of the $Al_UGa_{1-U}N$ layers 30a. In the arrangement of the $Al_UGa_{1-U}N$ layers 30a, the aluminum compositions of the $Al_UGa_{1-U}N$ layers 30a preferably have monotonic change in the direction from the semiconductor laminate 15 toward the substrate 13. The aluminum composition N3 of the $Al_VGa_{1-V}N$ layer 30b nearest to the semiconductor laminate 15 is smaller than the aluminum composition N4 of the $Al_VGa_{1-V}N$ layer 30b nearest to the substrate 13. In the example shown in part (a) of FIG. 1, the aluminum compositions of the $Al_UGa_{1-U}N$ layers 30a increase in the direction from the semiconductor laminate 15 to the substrate 13. In this III-nitride semiconductor electronic device, the graded composition in the multilayer film 29b allows improvement in crystal quality of the semiconductor layer that is provided on the multilayer film 29b. The $Al_VGa_{1-V}N$ (U<V≤1) layers preferably contain AlN, and the use of AlN permits implementation of higher resistance (or suppression of reduction in resistance). In the example shown in part (a) of FIG. 1, the aluminum compositions of the $Al_UGa_{1-U}N$ layers 30a increase in the direction from the semiconductor laminate 15 to the substrate 13, but the $Al_UGa_{1-U}N$ layers 30a may have a constant aluminum composition. The multilayer film 29b allows improvement in crystal quality of the semiconductor layer that is provided on the multilayer film 29b.

Next, FIGS. 2, 3, and 4 are drawings showing major steps in a method of fabricating a III-nitride semiconductor electronic device. In the steps hereinafter, growth of semiconductor crystals is carried out through the use of a growth reactor 10a. In the growth reactor 10a, the growth is carried out, for example, by metal-organic vapor phase epitaxy.

As shown in part (a) of FIG. 2, in step S101 a substrate 43 is loaded into the growth reactor 10a. The substrate 43 can be comprised of sapphire, SiC, Si, AlN, AlGaN or the like. This substrate 43 can be subjected to a thermal treatment of a primary surface 43a thereof. When the substrate 43 is comprised of sapphire, this thermal treatment can be carried out under the condition of the temperature of 1200 Celsius degrees in a hydrogen atmosphere. If necessary, a buffer layer is grown for the subsequent growth of a III-nitride semiconductor.

In step S102, as shown in part (b) of FIG. 2, a semiconductor laminate 45 is formed on the primary surface 43a of the substrate 43. The semiconductor laminate 45 has contact areas for ohmic electrode formation, and includes semiconductor layers, as described below, for a high electron mobility transistor. The semiconductor laminate 45 includes a buffer layer 49, a channel layer 51 and a barrier layer 53. The channel layer 51 and the barrier layer 53 are provided above the primary surface 43a of the substrate 43, and the barrier layer 53 makes a junction 54a with the channel layer 51. The channel layer 51 makes a junction 54b with the buffer layer 49. The buffer layer 49, channel layer 51, and barrier layer 53 are epitaxially grown on the primary surface 43a of the substrate 43. The channel layer 51 is comprised of a first III-nitride semiconductor, e.g., AlGaN or the like, which contains aluminum as a Group III constituent element. An aluminum composition of the first III-nitride semiconductor is not less than 0.16. The channel of a III-nitride material with a large Al composition is suitable for reduction in temperature dependence of on-resistance and temperature dependence of Id-max of the transistor. The barrier layer 53 is comprised of a second III-nitride semiconductor, e.g., AlGaN or the like, which contains aluminum as a Group III constituent element. The bandgap of the second III-nitride semiconductor is larger than that of the first III-nitride semiconductor. The buffer layer 49 is comprised of a III-nitride semiconductor, e.g., AlN, AlGaN, or the like, which contains aluminum as a Group III constituent element. This III-nitride semiconductor has a higher resistivity than the channel layer 51, and the bandgap of the buffer layer 49 is identical to or greater than that of the first III-nitride semiconductor. After these steps, an epitaxial substrate E is taken out of the growth reactor 10a.

After formation of the semiconductor laminate 45, in order to measure the crystal quality of the semiconductor laminate 45, e.g., the channel layer 51 and the barrier layer 53, it is preferable to measure the X-ray rocking curve (XRC) of the semiconductor laminate 45, if necessary.

As described above, the semiconductor laminate 45 is not subjected to ion implantation for enhancing the carrier concentration in the semiconductor regions that will be immediately below the source electrode and/or the drain electrode. For this reason, the FWHM of the (10-12) plane of the channel layer 51 in X-ray rocking curve (XRC) is preferably less than 1000 arcsec and/or the FWHM of the (0002) plane of the channel layer 51 in XRC is preferably less than 1000 arcsec. Furthermore, the FWHM of the (10-12) plane of the barrier layer 53 in X-ray rocking curve (XRC) is preferably less than 1000 arcsec and/or the FWHM of the (0002) plane of the barrier layer 53 in XRC is preferably less than 1000 arcsec. In the electronic device produced without ion implantation, the crystal quality of the channel layer 51 and/or the barrier layer 53 in an electrode forming step is not significantly degraded as compared with the crystal quality in film formation. For this reason, in the device produced without ion implantation for source/drain, the FWHM of XRC for the (10-12) plane and/or the (0002) plane of the channel layer 51 and/or the barrier layer 53 is associated with the device characteristics of the III-nitride semiconductor electronic device. The crystal quality represented by the FWHM of XRC allows improvement in ohmic contact characteristics of electrodes and improvement in temperature characteristic of drain current.

Next, in step S103, ohmic electrodes are formed on the contact areas without use of ion implantation in the contact areas of the semiconductor laminate 45. An ohmic electrode includes, for example, at least either one of the drain electrode and the source electrode. The ohmic electrodes can be formed, for example, by the lift-off method.

A series of steps for forming the ohmic electrodes will be described below. In step S103, as shown in part (a) of FIG. 3, a mask 55 for making the ohmic electrodes is formed on the semiconductor laminate 45. The mask 55 has apertures 55a for formation of the ohmic electrodes on areas of the semiconductor laminate 45 (which will be referred hereinafter as "contact areas"). The mask 55 can be made of, for example, resist. The apertures 55a of the mask 55 are located on regions 45a and 45d of the semiconductor laminate 45. Surfaces of the regions 45a and 45d of the semiconductor laminate 45 are exposed in the respective apertures 55a. The mask 55 covers regions 45b, 45c, 45e, 45f and 45g of the semiconductor laminate 45. A gate electrode will be formed on the region 45b of the semiconductor laminate 45 in a subsequent step. The regions 45c and 45e of the semiconductor laminate 45 are provided for separating the ohmic electrodes from the gate electrode. The regions 45f and 45g of the semiconductor laminate 45 are provided for isolation of devices. The region 45a including the contact area of the semiconductor laminate 45 is located between the region 45c and the region 45f, and the region 45d including the contact area of the semiconductor laminate 45 is located between the region 45e and the region 45g. The region 45b including a gate area of the semiconductor laminate 45 is located between the region 45c and the region 45e. The region 45c including a separation area of the semiconductor laminate 45 is located between the region 45a and the region 45b, and the region 45e including a separation area of the semiconductor laminate 45 is located between the region 45b and the region 45d.

After formation of the mask 55, in step S104 is, as shown in part (b) of FIG. 3, a metal film 57 for ohmic electrodes is grown on the mask 55 and the substrate 43. The ohmic electrodes can contain, for example, Zr and Al. This manufacturing method can reduce the contact resistance to the III-nitride semiconductor, which contains aluminum as a Group III constituent element, without need for ion implantation. Furthermore, it can provide excellent contact resistance to the III-nitride semiconductor having a high Al composition.

In the present example, in step S104-1, the epitaxial substrate E is placed first in a deposition system 10b, and then a first electrode film 57a is grown on the contact areas and the substrate 43. This electrode film 57a can include, for example, a Zr film, and the growth of the Zr film is carried out, for example, by electron beam evaporation. The thickness of the Zr film can be, for example, in the range of 1 nm to 100 nm. Next, in step S104-2, a second electrode film 57b is grown on the contact areas and the substrate 43. This electrode film 57b can include, for example, an Al film, and the growth of the Al film is carried out, for example, by electron beam evaporation. The thickness of the Al film can be, for example, in the range of 4 nm to 400 nm.

After growth of these electrode films 57a and 57b, in step S105, as shown in part (a) of FIG. 4, patterning of the electrode films 57a and 57b is performed by lift-off to form metal layers 59a and 59b on the regions 45a and 45d, respectively.

After formation of the metal layers 59a and 59b, the substrate is placed in a thermal treatment system 10c. In step S106, as shown in part (b) of FIG. 4, a thermal treatment is carried out at the temperature of not less than 400 Celsius degrees and not more than 1200 Celsius degrees under flow of a thermal treatment gas G in the thermal treatment system 10c. This manufacturing method can form electrodes 61a and 61b demonstrating an excellent ohmic contact. The thermal treatment gas contains, for example, nitrogen, argon, helium, ammonia or oxygen. Before the formation of the electrode film 57, the regions which will be located immediately below the electrodes 61a, 61b are not subjected to ion implantation for enhancing the carrier concentration. An n-type impurity concentration (e.g., Si) of the channel layer 51 in the regions 45a and 45d is the same as an n-type impurity concentration in the channel layer 51 in the regions 45b, 45c and 45e. An n-type impurity concentration of the barrier layer 53 in the regions 45a and 45d is the same as that in the barrier layer 53 in the regions 45b, 45c and 45e.

A step of forming a Schottky electrode will be described below. In step S107, as shown in part (a) of FIG. 5, a mask 65 for formation of the Schottky electrode is formed on the semiconductor laminate 45, and thereafter a metal film 67 for the Schottky electrode is grown thereon. As shown in part (b) of FIG. 5, patterning of this film 67 is carried out by lift-off to form a Schottky electrode 63 on the region 45b. The Schottky electrode 63 acts as a gate electrode in the present example.

In this manufacturing method, the channel layer 51 is made of the first III-nitride semiconductor that contains aluminum as a Group III constituent element, and the barrier layer 53 is made of the second III-nitride semiconductor that contains aluminum as a Group III constituent element. Hence, the III-nitride semiconductor electronic device can be manufactured as shown in part (b) of FIG. 5, and such an electronic device can reduce degradation in the Id-max characteristics. Furthermore, since the electrodes are formed on the contact areas without ion implantation in the contact areas of the semiconductor laminate 45, the III-nitride semiconductor electronic device is provided as one capable of further reducing degradation in the Id-max characteristics.

Example 1

An example according to the present embodiment will be described below.

Fabrication of HEMT Device A

A high electron mobility transistor (HEMT) including a GaN channel layer is fabricated by the method as described below.

A low-temperature GaN buffer layer is grown on a sapphire substrate by the metal-organic vapor phase epitaxy (MOVPE) method. The growth temperature is 500 Celsius degrees, and the thickness of the GaN layer is 25 nm. Next, an undoped GaN channel layer is grown on this buffer layer. The growth temperature was 1050 Celsius degrees, and the thickness of the GaN layer is 1 µm. Subsequently, an undoped AlGaN barrier layer is grown on this GaN channel layer. The growth temperature is 1050 Celsius degrees, the thickness of the AlGaN layer is 25 µm, and the Al composition thereof is 0.2. A HEMT epitaxial film A is made through these steps.

A HEMT device including the electrodes of Ti/Al and the GaN channel layer is formed by the method as described below. Ti/Al/Ti/Au is evaporated to form a metal film for ohmic electrodes (source electrode and drain electrode), and thereafter pattern formation of this film and a thermal treatment at 850 Celsius degrees are carried out to form the ohmic electrodes (source electrode and drain electrode). Thereafter, Ni/Au metal is evaporated to form a film for a Schottky electrode (gate electrode) and then pattern formation of this film is carried out to form the Schottky electrode (gate electrode).

The dimensions of the HEMT device are as follows: Lg=2 µm; Lgd=5 µm; and Wg=500 µm. This device will be hereinafter referred to as HEMT device A.

Fabrication of HEMT Device B

A high electron mobility transistor (HEMT) including an AlGaN channel layer is fabricated by the method as described below.

An AlN buffer layer is grown on a sapphire substrate by the metal-organic vapor phase epitaxy (MOVPE) method. The temperature is 1250 Celsius degrees, and the thickness of the AlN layer is 900 nm. Next, an undoped AlGaN channel layer is grown on this buffer layer. The growth temperature is 1100 Celsius degrees, the thickness of the AlGaN layer is 600 nm, and the Al composition thereof is 0.3. Subsequently, an undoped AlGaN barrier layer is grown on this AlGaN channel layer. The growth temperature is 1100 Celsius degrees, the thickness of the AlGaN layer is 30 nm, and the Al composition thereof is 0.5. A HEMT epitaxial film is made through these steps.

Concerning the XRC full widths at half maximum (FWHMs) for the resultant AlN layer, the FWHM for the C-plane thereof is 447 arcsec and the FWHM for the R-plane thereof is 742 arcsec. Concerning the XRC FWHMs for the AlGaN layer, the FWHM for the C-plane thereof is 513 arcsec, and the FWHM for the R-plane thereof is 711 arcsec. The sheet resistance of two-dimensional electron gas associated with the AlGaN layer is 2754 Ω/sq., which is an excellent value. A HEMT epitaxial film B is produced through these steps.

Ti/Al electrodes are produced by ion implantation, and a HEMT device including the AlGaN channel layer is fabricated by the method as described below.

For forming the ohmic electrodes (source electrode and drain electrode), ion implantation of Si is carried out in the epitaxial regions for formation of the source electrode and drain electrode. The conditions of the ion implantation are as follows: the energy of 50 keV and the dose concentration of $1 \times 10^{15}$ cm$^{-2}$. Thereafter, a SiN film is grown on a surface of the HEMT epitaxial film, and then a thermal treatment (temperature: 1150 Celsius degrees, and thermal treatment time: 5 minutes) for activation is carried out to activate Si ions. After the thermal treatment, the SiN film is removed.

Ti/Al/Ti/Au is evaporated to form a metal film for the ohmic electrodes (source electrode and drain electrode), and thereafter pattern formation of this film and a thermal treatment at 850 Celsius degrees are carried out to form the ohmic electrodes (source electrode and drain electrode). Thereafter, Ni/Au metals are evaporated to form a film for a Schottky electrode (gate electrode), and then pattern formation of this film is carried out to form the Schottky electrode (gate electrode).

The dimensions of the HEMT device are as follows: Lg=2 μm; Lgd=5 μm; and Wg=500 μm. This device will be hereinafter referred to as HEMT device B.

Fabrication of HEMT Device C

A high electron mobility transistor (HEMT) including an AlGaN channel layer is fabricated by the method as described below. A HEMT epitaxial film C is produced in the same structure as the HEMT epitaxial film B.

Zr/Al electrodes are produced without use of ion implantation, and a HEMT device including the AlGaN channel layer is fabricated by the method as described below.

The HEMT device including the electrodes of Zr/Al and AlGaN channel layer is fabricated. The evaporation of Zr/Al is carried out to form a metal film for the ohmic electrodes (source electrode and drain electrode), and thereafter pattern formation of this film and a thermal treatment at 850 Celsius degrees are carried out to form the ohmic electrodes (source electrode and drain electrode). Thereafter, the evaporation of Ni/Au is carried out to form a film for a Schottky electrode (gate electrode), and then pattern formation of this film is carried out to produce the Schottky electrode (gate electrode).

The dimensions of the HEMT device are as follows: Lg=2 μm; Lgd=5 μm; and Wg=500 μm. This device will be hereinafter referred to as HEMT device C.

After the device fabrication of the HEMT devices A, B and C, their transistor characteristics are evaluated. FIG. 6 is a drawing showing the temperature dependences of maximum drain current (Id-max) of HEMT devices A, B and C, and FIG. 7 is a drawing showing the summary of temperature dependences of maximum drain current (Id-max) of HEMT devices A, B and C. With reference to part (a) of FIG. 6, a comparison of maximum drain current (Id-max) is shown among the HEMT devices A, B and C, and shows that the temperature dependence of HEMT device C is smaller than that of HEMT device A and smaller than that of HEMT device B. The temperature dependence of maximum drain current (Id-max) can be reduced when ion implantation is not used in production of the ohmic electrodes. HEMT device C (AlGaN channel). Producing the ohmic contacts without use of ion implantation demonstrates an excellent characteristic. As indicated by the characteristics of HEMT device C, the ohmic contact production method without use of ion implantation can provide the HEMT device C (AlGaN channel) with the excellent characteristics.

With reference to part (b) of FIG. 6, comparison of reduction rates of maximum drain current (Id-max) is shown among HEMT devices A, B and C, and shows that the reduction rate of HEMT device C is smaller than that of HEMT device A and smaller than that of HEMT device B. When ion implantation is not used in production of the ohmic electrodes, the reduction rate of maximum drain current (Id-max) can be reduced.

With HEMT device A (GaN channel HEMT), the maximum drain current at the operating temperature of 300 Celsius degrees is reduced to approximately one third of the maximum drain current at room temperature. On the other hand, with HEMT devices B and C (AlGaN channel HEMTs), the temperature dependence of maximum drain current is clearly smaller than that of HEMT device A.

The temperature dependence of maximum drain current in HEMT device C formed without use of ion implantation is smaller than that in HEMT device B formed with use of ion implantation for production of the source electrode and drain electrode, which is a significant advantage over the electrode forming technology that uses ion implantation. For example, Zr/Al electrodes are applied to this HEMT device C.

The method that uses the ion implantation and activation annealing in production of ohmic electrodes has possibilities of failure in eliminating device deterioration, such as introduction of damage or defects to the epitaxial layer due to the ion implantation, and introduction of damage due to the activation annealing at high temperature. Since these steps form, for example, deep levels in the semiconductors, electric current is likely to become less in flowing in the transistor at high temperature and it can result in increase in a transistor performance in the transistor operation at high temperature, e.g., temperature dependence of Id-max.

When the ohmic electrodes are formed without use of ion implantation, the device is subjected to a thermal treatment necessary for alloying for formation of the ohmic electrodes (e.g., at 850 Celsius degrees) as a major thermal treatment. No use of ion implantation can significantly reduce formation of defects, damage, deep levels, etc. caused with use of the ion implantation and activation annealing. This can be a cause to make the electric property of HEMT device C better than that of HEMT device B in the high-temperature operation as well.

The inventors conducted an additional experiment. It is found by the additional experiment that the sheet resistance of the AlGaN channel layer can be reduced by improving the crystallinity of the AlGaN channel layer (i.e., by reducing the FWHM of XRC) in AlGaN channel HEMT. For example, the FWHM of X-ray rocking curve (XRC) for the (10-12) plane of the semiconductor layer is preferably less than 1000 arcsec. Furthermore, the FWHM of XRC for the (0002) plane of the semiconductor layer is preferably less than 1000 arcsec.

Example 2

The inventors conducted a further additional experiment. Concerning the further additional experiment, FIGS. 8 and 9 show the fabrication conditions and measurement results in the further additional experiment. In this experiment, an AlN layer is grown on various substrates, and thereafter an AlGaN channel layer and an AlGaN barrier layer are grown on this AlN layer.

This experiment shows as follows.
1. Impurity concentrations (e.g. hydrogen (H), carbon (C), and oxygen (O)) can be reduced by improvement in crystallinity of AlGaN (FWHM of XRC).
2. When the ohmic electrodes are formed without use of ion implantation for ohmic electrodes, the crystallinity of the AlGaN channel layer is improved and, in conjunction therewith, the temperature dependence of HEMT device (e.g., Id-max) is improved so as to decrease the temperature dependence. For example, Zr/Al electrodes are used as ohmic electrodes.

On the other hand, when the ohmic electrodes (Ti/Al) are formed with ion implantation, there is little association between improvement in crystallinity of the AlGaN channel layer and temperature dependence, and the temperature dependence remains large.

The results of these experiments show that the temperature dependence of HEMT device can be reduced by producing the ohmic electrodes without use of ion implantation, e.g., by use of Zr/Al electrodes as the ohmic electrodes and by improvement in crystallinity of AlGaN. Furthermore, the temperature dependence of HEMT device can be further reduced by adopting the buffer structure provided between the AlGaN channel layer and the substrate or by improving the crystallinity of the AlGaN channel layer and the AlGaN barrier layer. Regarding the Zr/Al electrode, the excellent result can be achieved for the ohmic contact when the FWHM of XRC for the underlying semiconductor below the electrode is less than 1000 arcsec.

In the foregoing experiment, the AlN epitaxial film is grown on the sapphire substrate, and thereafter the AlGaN epitaxial film for the channel layer is grown thereon. When an epitaxial structure is made as described below on a sapphire substrate. a SiC substrate or the like, the crystallinity of this AlGaN epitaxial film can be improved. It is verified by experiment that the following exemplary structures can achieve improvement in crystallinity of the AlGaN channel layer (improvement in the FWHM of XRC): an AlGaN buffer layer with continuously graded composition is grown instead of the AlN epitaxial film and the AlGaN epitaxial film is grown on this AlGaN buffer layer; an alternate stack of plural AlN thin layers and plural AlGaN thin layers with Al compositions gradually decreasing in the direction from the substrate to the channel film is used instead of the AlN epitaxial film and the AlGaN epitaxial film is grown on this stack structure.

Explanation on structures X1-X8 of HEMT devices shown in FIGS. 8 and 9 will be made below.

A growth method of the structure X4 of the HEMT device is described below. An AlN epitaxial layer, an AlGaN channel layer, and an AlGaN barrier layer are grown on a sapphire substrate as described below. The sapphire substrate is placed in a MOVPE reactor and thereafter an AlN layer (thickness: 900 nm) is grown at the growth temperature of 1250 Celsius degrees. On this AlN layer, an AlGaN layer (thickness 600 nm, Al composition 0.3) and an AlGaN layer (thickness 30 nm, Al composition 0.5) are grown at a temperature of 1100 Celsius degrees.

A growth method of the structure X1 of the HEMT device is described below. An AlN layer (thickness: 150 nm) is grown instead of the AlN layer (thickness: 900 nm) in the structure X4.

A growth method of the structure X2 of the HEMT device is described below. An AlN layer (thickness: 80 nm) is grown instead of the AlN layer (thickness: 900 nm) in the structure X4.

A growth method of the structure X3 of the HEMT device is described below. An AlN layer (thickness: 600 nm) is grown instead of the AlN layer (thickness: 900 nm) in the structure X4. In the structures X1-X4, in order to check influence of lattice mismatch between the sapphire substrate and the AlGaN layer, the AlN layer is grown in the different thicknesses.

A growth method of the structure X5 of the HEMT device is described below. A composition-graded AlGaN layer (thickness: 600 nm, Al composition: continuously varying from 0.9 to 0.3) is grown at the growth temperature of 1100 Celsius degrees, instead of the AlN layer (thickness: 900 nm) in the structure X4.

A growth method of the structure X6 of the HEMT device is described below. A superlattice epitaxial AlN/AlGaN film (thickness of AlN layers 5 nm, thickness of AlGaN layers 25 nm, alternate repetitions: 20 layers) is grown at the growth temperature of 1100 Celsius degrees, instead of the AlN layer (thickness: 900 nm) in the structure X4. The AlGaN layers in the superlattice epitaxial AlN/AlGaN film have the Al compositions stepwise decreasing from 0.9 to 0.3.

A growth method of the structure X7 of the HEMT device is described below. An AlN substrate is used instead of the sapphire substrate in the structure X4.

A growth method of the structure X8 of the HEMT device is described below. An AlGaN (Al composition 0.3) substrate is used instead of the sapphire substrate in the structure X4, and an AlGaN layer (thickness 600 nm, Al composition 0.3) and an AlGaN layer (thickness 30 nm, Al composition 0.5) are grown without growth of the AlN layer at a temperature of 1100 Celsius degrees.

The same process as in Example 1 (the method using the ion implantation and activation annealing, or the method using the Zr/Al electrodes) is applied as a method for producing the electrodes in the structures of these HEMT devices.

The Zr/Al electrodes are described as an example of the method for producing the ohmic electrodes without application of the ion implantation method for the HEMT epitaxial structures including the AlGaN channel layer, but the other ohmic electrodes can also be applied as long as the ion implantation method is not used; use of such electrodes, as well as the Zr/Al electrodes, can provide excellent temperature dependence in the AlGaN channel HEMTs.

As described above, the HEMT devices having the AlGaN channel layer can employ an AlN template on the sapphire substrate or the like. Furthermore, the substrate can be a SiC substrate, Si substrate, or the like other than the sapphire substrate. The substrate can also be a III-nitride substrate, such as an AlN substrate or an AlGaN substrate. For obtaining an excellent ohmic contact, it is preferable that the FWHM of XRC for the epitaxial structure grown on the substrate be less than 1000 arcsec. This also provides an excellent ohmic contact, as well as the excellent sheet resistance in the AlGaN epitaxial film. The composition-degraded AlGaN layer or the AlN/AlGaN superlattice film is suitable for improvement in crystallinity.

In the III-nitride semiconductor HEMT device in the present embodiment, the maximum drain current (at 200 Celsius degrees) is not less than 0.68 times that at room temperature (27 Celsius degrees). Furthermore, the maximum drain current (at 300 Celsius degrees) is not less than 0.55 times that at room temperature (27 Celsius degrees). (This is seen from the experiment data of sample X-3 in FIG. 9.)

Figure 10:
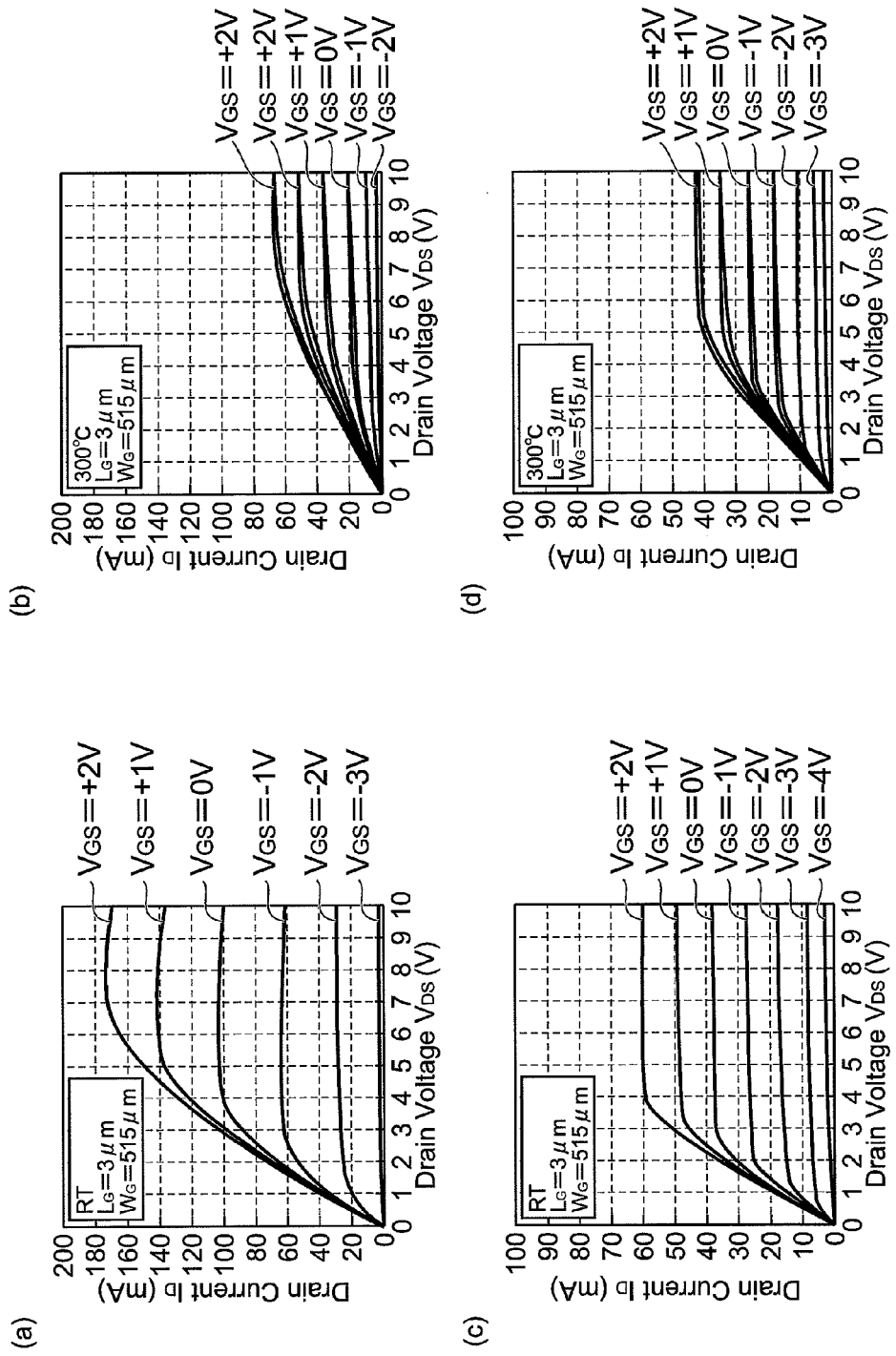
FIG. 10 is a drawing showing current characteristics of a high electron mobility transistor fabricated according to an embodiment of the present invention.

FIG. 10 is a drawing showing current characteristics of a high electron mobility transistor with a similar structure, which is fabricated in accordance with the present embodiment. The device structure in this measurement will be described below. A heterojunction of AlGaN barrier layer/ AlGaN channel layer is grown by MOVPE on a C-plane AlN substrate. In the barrier layer, the Al composition was 0.5 and the thickness thereof was 21 nm. In the channel layer, the Al composition is 0.24 and the thickness 600 nm. The ohmic electrodes are made using Zr/Al/Mo/Au and the Schottky electrode is made using Ni/Au. The gate length and the gate width are 3 µm and 515 µm, respectively. For a comparison, a HEMT with an AlGaN/GaN heterojunction in the same dimensions is also fabricated on a Si substrate. In the barrier layer, the Al composition is 0.25 and the thickness is 25 nm. Parts (a) and (b) of FIG. 10 show the I-V characteristics of the GaN channel HEMT, and parts (c) and (d) of FIG. 10 show the I-V characteristics of the AlGaN channel HEMT.

The measurements are carried out with change in temperature from room temperature to 300 Celsius degrees, and the DC characteristic of each HEMT is measured with a semiconductor parameter analyzer and a curve tracer for every change in temperature. According to the I-V characteristics at room temperature and 300 Celsius degrees, as shown in FIG. 10, the AlGaN channel HEMT and the GaN channel HEMT both show excellent pinch-off characteristics and saturation characteristics. From this result, the maximum drain current of the GaN channel HEMT is about three times that of the AlGaN channel HEMT at room temperature. The both HEMT devices show decrease of drain current with increase in temperature. In the tendency of normalized drain current, which is obtained by normalizing the drain current value at each temperature with respect to the drain current at room temperature, the AlGaN channel HEMT exhibits that reduction in normalized drain current is made smaller with increase in temperature. Besides the drain current, comparison is similarly made for on-resistance (Ron), gate leak current, and threshold voltage as well in temperature dependency. Concerning Ron, its increasing rate in the AlGaN channel HEMT is smaller, about half of that in the GaN channel HEMT. Concerning the gate leak current, the AlGaN channel HEMT exhibits that values in the gate leak current are made smaller approximately by an order of magnitude than the GaN channel HEMT. The threshold voltage of the AlGaN channel HEMT exhibits no substantial dependence on temperature.

With the foregoing AlGaN channel HEMT on the AlN substrate, a change rate of drain current in temperature dependency in the AlGaN channel HEMT is approximately half of the value in the GaN channel HEMT in high-temperature operation.

The III-nitride semiconductors such as GaN and AlN are expected as materials that can provide high breakdown voltage, high temperature operation, and high frequency devices. In recent years, high-temperature operation is required in in-vehicle power switching devices and others. For developing such devices to implement the high-temperature operation, it is desirable to use a channel material of a semiconductor with a large bandgap. In the present example, the DC characteristics are evaluated in the high-temperature operation of the AlGaN channel HEMT, and the AlGaN channel HEMT is found to have great potential when compared with the GaN channel HEMT.

Still another aspect of the present invention is a method for fabricating an ohmic electrode for a III-nitride semiconductor electronic device. This method comprises the steps of (a) forming a semiconductor laminate on a primary surface of a substrate, the semiconductor laminate having a contact area for the ohmic electrode and including a semiconductor layer of a III-nitride semiconductor which contains aluminum as a Group III constituent element; and (b) forming a first electrode on the contact area of the semiconductor laminate. An aluminum composition of the III-nitride semiconductor is not less than 0.16. This method can provide the high Al composition III-nitride semiconductor with excellent contact resistance. The first electrode can contain, for example, Zr and Al.

As described above, the embodiment of the present invention provides the III-nitride semiconductor electronic device capable of reducing degradation in the Id-max characteristics. The embodiment of the present invention provides the method of fabricating the III-nitride semiconductor electronic device, which can reduce the Id-max characteristic degradation as well.

Having illustrated and described the principle of the present invention was in the preferred embodiments, and it can be understood by those skilled in the art that the present invention can be modified in arrangement and detail without departing from such principle. The present invention is by no means limited to the specific configurations disclosed in the embodiments of the present invention. Therefore, the applicants claim all modifications and changes falling within the scope of claims and resulting from the scope of spirit thereof.

What is claimed is:

1. A III-nitride semiconductor electronic device comprising:
    a substrate;
    a semiconductor laminate provided on a primary surface of the substrate;
    a first electrode in contact with the semiconductor laminate; and
    a second electrode provided on the semiconductor laminate,
    the semiconductor laminate including a channel layer and a barrier layer, the channel layer being provided on the primary surface of the substrate, and the barrier layer making a junction with the channel layer,
    the channel layer comprising a first III-nitride semiconductor, the first III-nitride semiconductor containing aluminum as a Group III constituent element,
    the barrier layer comprising a second III-nitride semiconductor, the second III-nitride semiconductor containing aluminum as a Group III constituent element,
    the semiconductor laminate including first, second and third regions, the first, second and third regions being arranged along the primary surface of the substrate, and the third region being located between the first region and the second region,
    the barrier layer including first to third portions included in the first to third regions, respectively,
    a concentration of impurity in the first portion being the same as a concentration of impurity in the second portion, and the first and second electrodes being provided on the first and second regions, respectively,
    the first electrode including either one of a drain electrode and a source electrode,
    the second electrode including a gate electrode, and
    an aluminum composition of the first III-nitride semiconductor being not less than 0.16, and a bandgap of the second III-nitride semiconductor being larger than a bandgap of the first III-nitride semiconductor, wherein a full width at half maximum of an X-ray rocking curve (XRC) for a (10-12) plane of the channel layer is less than 1000 arcsec.

2. The III-nitride semiconductor electronic device according to claim 1, wherein the channel layer includes first to third portions included in the first to third regions, respectively, and an impurity concentration of the first portion is the same as an impurity concentration of the second portion.

3. The III-nitride semiconductor electronic device according to claim 1, wherein the impurity includes silicon.

4. The III-nitride semiconductor electronic device according to claim 1, further comprising an $Al_XGa_{1-X}N$ ($0<X\leq1$) layer provided between the semiconductor laminate and the substrate.

5. The III-nitride semiconductor electronic device according to claim 1, wherein the substrate comprises $Al_YGa_{1-Y}N$ ($0<Y\leq1$).

6. The III-nitride semiconductor electronic device according to claim 1, further comprising an $Al_ZGa_{1-Z}N$ ($0<Z\leq1$) layer provided between the semiconductor laminate and the substrate, wherein an aluminum composition of the $Al_ZGa_{1-Z}N$ layer monotonically increases in a direction from the semiconductor laminate to the substrate.

7. The III-nitride semiconductor electronic device according to claim 1, wherein the channel layer comprises AlGaN, and the barrier layer comprises AlGaN.

8. The III-nitride semiconductor electronic device according to claim 1, wherein a hydrogen concentration of the channel layer is less than $3\times10^{18}$ cm$^{-3}$.

9. The III-nitride semiconductor electronic device according to claim 1, wherein a carbon concentration of the channel layer is not more than $2.5\times10^{17}$ cm$^{-3}$.

10. The III-nitride semiconductor electronic device according to claim 1, wherein an oxygen concentration of the channel layer is not more than $4.3\times10^{17}$ cm$^{-3}$.

11. The III-nitride semiconductor electronic device according to claim 1, wherein a maximum drain current at 200 Celsius degrees is not less than 0.68 times a maximum drain current at room temperature.

12. The III-nitride semiconductor electronic device according to claim 1, wherein a maximum drain current at 300 Celsius degrees is not less than 0.55 times a maximum drain current at room temperature.

13. The III-nitride semiconductor electronic device according to claim 1, wherein the first electrode comprises Zr and Al.

14. A III-nitride semiconductor electronic device comprising:
a substrate;
a semiconductor laminate provided on a primary surface of the substrate;
a first electrode in contact with the semiconductor laminate; and
a second electrode provided on the semiconductor laminate,
the semiconductor laminate including a channel layer and a barrier layer, the channel layer being provided on the primary surface of the substrate, and the barrier layer making a junction with the channel layer,
the channel layer comprising a first III-nitride semiconductor, the first III-nitride semiconductor containing aluminum as a Group III constituent element,
the barrier layer comprising a second III-nitride semiconductor, the second III-nitride semiconductor containing aluminum as a Group III constituent element,
the semiconductor laminate including first, second and third regions, the first, second and third regions being arranged along the primary surface of the substrate, and the third region being located between the first region and the second region,
the barrier layer including first to third portions included in the first to third regions, respectively,
a concentration of impurity in the first portion being the same as a concentration of impurity in the second portion, and the first and second electrodes being provided on the first and second regions, respectively,
the first electrode including either one of a drain electrode and a source electrode,
the second electrode including a gate electrode, and
an aluminum composition of the first III-nitride semiconductor being not less than 0.16, and a bandgap of the second III-nitride semiconductor being larger than a bandgap of the first III-nitride semiconductor,
wherein a full width at half maximum of an XRC for a (0002) plane of the channel layer is less than 1000 arcsec.

15. The III-nitride semiconductor electronic device according to claim 14, wherein the channel layer includes first to third portions included in the first to third regions, respectively, and an impurity concentration of the first portion is the same as an impurity concentration of the second portion.

16. The III-nitride semiconductor electronic device according to claim 14, wherein the impurity includes silicon.

17. The III-nitride semiconductor electronic device according to claim 14, further comprising an $Al_XGa_{1-X}N$ ($0<X\leq1$) layer provided between the semiconductor laminate and the substrate.

18. The III-nitride semiconductor electronic device according to claim 14, wherein the substrate comprises $Al_YGa_{1-Y}N$ ($0<Y\leq1$).

19. The III-nitride semiconductor electronic device according to claim 14, further comprising an $Al_ZGa_{1-Z}N$ ($0<Z\leq1$) layer provided between the semiconductor laminate and the substrate, wherein an aluminum composition of the $Al_ZGa_{1-Z}N$ layer monotonically increases in a direction from the semiconductor laminate to the substrate.

20. The III-nitride semiconductor electronic device according to claim 14, wherein the channel layer comprises AlGaN, and the barrier layer comprises AlGaN.

21. The III-nitride semiconductor electronic device according to claim 14, wherein a hydrogen concentration of the channel layer is less than $3\times10^{18}$ cm$^{-3}$.

22. The III-nitride semiconductor electronic device according to claim 14, wherein a carbon concentration of the channel layer is not more than $2.5\times10^{17}$ cm$^{-3}$.

23. The III-nitride semiconductor electronic device according to claim 14, wherein an oxygen concentration of the channel layer is not more than $4.3\times10^{17}$ cm$^{-3}$.

24. The III-nitride semiconductor electronic device according to claim 14, wherein a maximum drain current at 200 Celsius degrees is not less than 0.68 times a maximum drain current at room temperature.

25. The III-nitride semiconductor electronic device according to claim 14, wherein a maximum drain current at 300 Celsius degrees is not less than 0.55 times a maximum drain current at room temperature.

26. The III-nitride semiconductor electronic device according to claim 14, wherein the first electrode comprises Zr and Al.

27. A III-nitride semiconductor electronic device comprising:
a substrate;
a semiconductor laminate provided on a primary surface of the substrate;

a first electrode in contact with the semiconductor laminate; and
a second electrode provided on the semiconductor laminate,
the semiconductor laminate including a channel layer and a barrier layer, the channel layer being provided on the primary surface of the substrate, and the barrier layer making a junction with the channel layer,
the channel layer comprising a first III-nitride semiconductor, the first III-nitride semiconductor containing aluminum as a Group III constituent element,
the barrier layer comprising a second III-nitride semiconductor, the second III-nitride semiconductor containing aluminum as a Group III constituent element,
the semiconductor laminate including first, second and third regions, the first, second and third regions being arranged along the primary surface of the substrate, and the third region being located between the first region and the second region,
the barrier layer including first to third portions included in the first to third regions, respectively,
a concentration of impurity in the first portion being the same as a concentration of impurity in the second portion, and the first and second electrodes being provided on the first and second regions, respectively,
the first electrode including either one of a drain electrode and a source electrode,
the second electrode including a gate electrode,
an aluminum composition of the first III-nitride semiconductor being not less than 0.16, and a bandgap of the second III-nitride semiconductor being larger than a bandgap of the first III-nitride semiconductor, and
a multilayer film provided between the semiconductor laminate and the substrate, wherein the multilayer film includes $Al_UGa_{1-U}N$ (0<U<1) layers and $Al_VGa_{1-V}N$ (U<V≤1) layers alternately arranged.

28. The III-nitride semiconductor electronic device according to claim 17, wherein the channel layer includes first to third portions included in the first to third regions, respectively, and an impurity concentration of the first portion is the same as an impurity concentration of the second portion.

29. The III-nitride semiconductor electronic device according to claim 27, wherein the impurity includes silicon.

30. The III-nitride semiconductor electronic device according to claim 27, wherein the substrate comprises $Al_YGa_{1-Y}N$ (0<Y≤1).

31. The III-nitride semiconductor electronic device according to claim 27, wherein the channel layer comprises AlGaN, and the barrier layer comprises AlGaN.

32. The III-nitride semiconductor electronic device according to claim 27, wherein a hydrogen concentration of the channel layer is less than $3 \times 10^{18}$ cm$^{-3}$.

33. The III-nitride semiconductor electronic device according to claim 27, wherein a carbon concentration of the channel layer is not more than $2.5 \times 10^{17}$ cm$^{-3}$.

34. The III-nitride semiconductor electronic device according to claim 27, wherein an oxygen concentration of the channel layer is not more than $4.3 \times 10^{17}$ cm$^{-3}$.

35. The III-nitride semiconductor electronic device according to claim 27, wherein a maximum drain current at 200 Celsius degrees is not less than 0.68 times a maximum drain current at room temperature.

36. The III-nitride semiconductor electronic device according to claim 27, wherein a maximum drain current at 300 Celsius degrees is not less than 0.55 times a maximum drain current at room temperature.

37. The III-nitride semiconductor electronic device according to claim 27, wherein the first electrode comprises Zr and Al.

38. A III-nitride semiconductor electronic device comprising:
a substrate;
a semiconductor laminate provided on a primary surface of the substrate;
a first electrode in contact with the semiconductor laminate; and
a second electrode provided on the semiconductor laminate,
the semiconductor laminate including a channel layer and a barrier layer, the channel layer being provided on the primary surface of the substrate, and the barrier layer making a junction with the channel layer,
the channel layer comprising a first III-nitride semiconductor, the first III-nitride semiconductor containing aluminum as a Group III constituent element,
the barrier layer comprising a second III-nitride semiconductor, the second III-nitride semiconductor containing aluminum as a Group III constituent element,
the semiconductor laminate including first, second and third regions, the first, second and third regions being arranged along the primary surface of the substrate, and the third region being located between the first region and the second region,
the barrier layer including first to third portions included in the first to third regions, respectively,
a concentration of impurity in the first portion being the same as a concentration of impurity in the second portion, and the first and second electrodes being provided on the first and second regions, respectively,
the first electrode including either one of a drain electrode and a source electrode,
the second electrode including a gate electrode,
an aluminum composition of the first III-nitride semiconductor being not less than 0.16, and a bandgap of the second III-nitride semiconductor being larger than a bandgap of the first III-nitride semiconductor, and
a multilayer film provided between the semiconductor laminate and the substrate, wherein the multilayer film including $Al_UGa_{1-U}N$ (0<U<1) layers and AlN layers alternately arranged, and aluminum compositions of the $Al_UGa_{1-U}N$ (0<U<1) layers monotonically increases in a direction from the semiconductor laminate to the substrate.

39. The III-nitride semiconductor electronic device according to claim 38, wherein the channel layer includes first to third portions included in the first to third regions, respectively, and an impurity concentration of the first portion is the same as an impurity concentration of the second portion.

40. The III-nitride semiconductor electronic device according to claim 38, wherein the impurity includes silicon.

41. The III-nitride semiconductor electronic device according to claim 38, wherein the substrate comprises $Al_YGa_{1-Y}N$ (0<Y≤1).

42. The III-nitride semiconductor electronic device according to claim 38, wherein the channel layer comprises AlGaN, and the barrier layer comprises AlGaN.

43. The III-nitride semiconductor electronic device according to claim 38, wherein a hydrogen concentration of the channel layer is less than $3 \times 10^{18}$ cm$^{-3}$.

44. The III-nitride semiconductor electronic device according to claim 38, wherein a carbon concentration of the channel layer is not more than $2.5 \times 10^{17}$ cm$^{-3}$.

45. The III-nitride semiconductor electronic device according to claim 38, wherein an oxygen concentration of the channel layer is not more than $4.3 \times 10^{17}$ cm$^{-3}$.

46. The III-nitride semiconductor electronic device according to claim 38, wherein a maximum drain current at 200 Celsius degrees is not less than 0.68 times a maximum drain current at room temperature.

47. The III-nitride semiconductor electronic device according to claim 38, wherein a maximum drain current at 300 Celsius degrees is not less than 0.55 times a maximum drain current at room temperature.

48. The III-nitride semiconductor electronic device according to claim 38, wherein the first electrode comprises Zr and Al.

* * * * *

UNITED STATES PATENT AND TRADEMARK OFFICE
CERTIFICATE OF CORRECTION

| | | |
|---|---|---|
| PATENT NO. | : 8,653,561 B2 | Page 1 of 1 |
| APPLICATION NO. | : 13/038071 | |
| DATED | : February 18, 2014 | |
| INVENTOR(S) | : Hashimoto et al. | |

It is certified that error appears in the above-identified patent and that said Letters Patent is hereby corrected as shown below:

In the claims:

At Claim 28, column 23, line 39, replace "claim 17" with --claim 27--.

Signed and Sealed this
Second Day of September, 2014

Michelle K. Lee
*Deputy Director of the United States Patent and Trademark Office*